United States Patent
Jung

(10) Patent No.: US 10,854,262 B2
(45) Date of Patent: Dec. 1, 2020

(54) MEMORY DEVICE

(71) Applicant: SAMSUNG ELECTRONICS CO., LTD., Suwon-si (KR)

(72) Inventor: Sang-Hoon Jung, Hwaseong-si (KR)

(73) Assignee: SAMSUNG ELECTRONICS, CO., LTD., Suwon-si (KR)

( * ) Notice: Subject to any disclaimer, the term of this patent is extended or adjusted under 35 U.S.C. 154(b) by 0 days.

(21) Appl. No.: 16/547,027

(22) Filed: Aug. 21, 2019

(65) Prior Publication Data

US 2020/0234749 A1 Jul. 23, 2020

(30) Foreign Application Priority Data

Jan. 21, 2019 (KR) ........................ 10-2019-0007538

(51) Int. Cl.
| | | |
|---|---|---|
| *G11C 11/00* | (2006.01) | |
| *G11C 11/16* | (2006.01) | |
| *H01L 27/22* | (2006.01) | |
| *H03K 19/20* | (2006.01) | |

(52) U.S. Cl.
CPC ........ *G11C 11/1675* (2013.01); *G11C 11/161* (2013.01); *G11C 11/1655* (2013.01); *G11C 11/1657* (2013.01); *G11C 11/1659* (2013.01); *H01L 27/228* (2013.01); *H03K 19/20* (2013.01)

(58) Field of Classification Search
CPC ............ G11C 11/1675; G11C 11/1655; G11C 11/161; G11C 11/1657; G11C 11/1659
See application file for complete search history.

(56) References Cited

U.S. PATENT DOCUMENTS

| | | | |
|---|---|---|---|
| 7,239,541 B2 | 7/2007 | Saito et al. | |
| 7,768,822 B2 | 8/2010 | Sheu et al. | |
| 8,422,277 B2 | 4/2013 | Cao et al. | |
| 8,625,338 B2 | 1/2014 | Zhu et al. | |
| 8,699,262 B2 | 4/2014 | Watanabe et al. | |
| 8,830,734 B2 | 9/2014 | Roelofs et al. | |
| 9,583,170 B2 | 2/2017 | Kim et al. | |
| 2003/0179602 A1* | 9/2003 | Lee .................... | G11C 11/14 365/158 |
| 2014/0219002 A1* | 8/2014 | Lee .................... | G11C 11/1659 365/148 |
| 2019/0304527 A1* | 10/2019 | Kim .................... | H01L 43/08 |
| 2019/0355402 A1* | 11/2019 | Hao .................... | G11C 11/1655 |
| 2020/0035281 A1* | 1/2020 | Kim .................... | G11C 7/04 |

FOREIGN PATENT DOCUMENTS

JP 5150932 B2 2/2013

* cited by examiner

*Primary Examiner* — Toan K Le
(74) *Attorney, Agent, or Firm* — Lee IP Law, P.C.

(57) ABSTRACT

A memory device includes a first memory cell that is connected with a first source line, a first word line, and a first bit line, a first write circuit to receive first write data that are stored in the first memory cell through a first write input/output line and to control a voltage of the first source line and a voltage of the first bit line based on the first write data, and a first pull-down circuit to receive first pull-down data corresponding to the first write data from the first write circuit through a first internal metal line and to pulls down the voltage of at least one of the first source line and the first bit line to a predetermined voltage based on the first pull-down data.

20 Claims, 15 Drawing Sheets

MEMORY DEVICE

CROSS-REFERENCE TO RELATED APPLICATION

This application claims priority under 35 U.S.C. § 119 to Korean Patent Application No. 10-2019-0007538, filed on Jan. 21, 2019, in the Korean Intellectual Property Office, the disclosures of which are incorporated by reference herein in their entireties.

BACKGROUND

1. Field

Exemplary embodiments described herein relate to a semiconductor device, and more particularly, relate to a memory device.

2. Description of the Related Art

A semiconductor memory device is classified as a volatile memory device, in which stored data are lost when a power is turned off, e.g., a static random access memory (SRAM) or a dynamic random access memory (DRAM), or a non-volatile memory device, in which stored data are retained when a power is turned off, e.g., a flash memory device, a phase-change RAM (PRAM), a magnetic RAM (MRAM), a resistive RAM (RRAM), or a ferroelectric RAM (FRAM).

The MRAM may include a magnetic tunnel junction (MTJ). A magnetization direction of the MTJ may be changed according to a direction of a current that is applied to the MTJ. A resistance value of the MTJ may vary according to the magnetization direction of the MTJ. The MRAM may store data by controlling the magnetization direction of the MTJ and may read data based on the resistance value of the MTJ.

SUMMARY

Embodiments are directed to a memory device including a first memory cell that is connected with a first source line, a first word line, and a first bit line; a first write circuit to receive first write data that are stored in the first memory cell through a first write input/output line, and to control a voltage of the first source line and a voltage of the first bit line based on the first write data; and a first pull-down circuit to receive first pull-down data corresponding to the first write data from the first write circuit through a first internal metal line, and to pull down the voltage of one of the first source line and the first bit line to a predetermined voltage based on the first pull-down data.

Embodiments are directed to a memory device including a first sub memory cell array including first memory cells that are respectively connected with a plurality of word lines; a second sub memory cell array including second memory cells that are respectively connected with the plurality of word lines; a dummy area between the first and second sub memory cell arrays, the dummy area in which a first internal metal line and a second internal metal line are formed; a first write circuit to control a voltage of a first bit line and a voltage of a first source line based on first write data received through a first write input/output line, the first bit line and the first source line being connected with the first memory cells; a first pull-down circuit to receive first pull-down data corresponding to the first write data from the first write circuit through the first internal metal line and to pull down the voltage of the first source line or the first bit line to a first predetermined voltage based on the first pull-down data; a second write circuit to control a voltage of a second bit line and a voltage of a second source line based on second write data received through a second write input/output line, the second bit line and the second source line being connected with the second memory cells; and a second pull-down circuit to receive second pull-down data corresponding to the second write data from the second write circuit through the second internal metal line and to pull down the voltage of the second source line or the second bit line to a second predetermined voltage based on the second pull-down data.

Embodiments are directed to a memory device including a memory cell array in a core area of a semiconductor substrate, the memory cell array including a plurality of memory cells connected to a plurality of word lines; a write driver in a peripheral area of the semiconductor substrate, the write driver to control voltages of a plurality of bit lines and voltages of a plurality of source lines based on first write data received through write input/output lines, the plurality of bit lines and the plurality of source lines being connected with the plurality of memory cells; and a pull-down driver to receive first pull-down data corresponding to the first write data from the write driver through at least one internal metal line and to pull down the voltages of the plurality of bit lines or the voltages of the plurality of source lines to a predetermined voltage based on the first pull-down data. The at least one internal metal line crosses the core area and extends from the write driver to the pull-down driver.

BRIEF DESCRIPTION OF THE DRAWINGS

Features will become apparent to those of skill in the art by describing in detail exemplary embodiments with reference to the attached drawings in which.

DETAILED DESCRIPTION

Exemplary embodiments may be described in detail and clearly to such an extent that an ordinary one in the art easily implements the embodiments.

Figure 1:
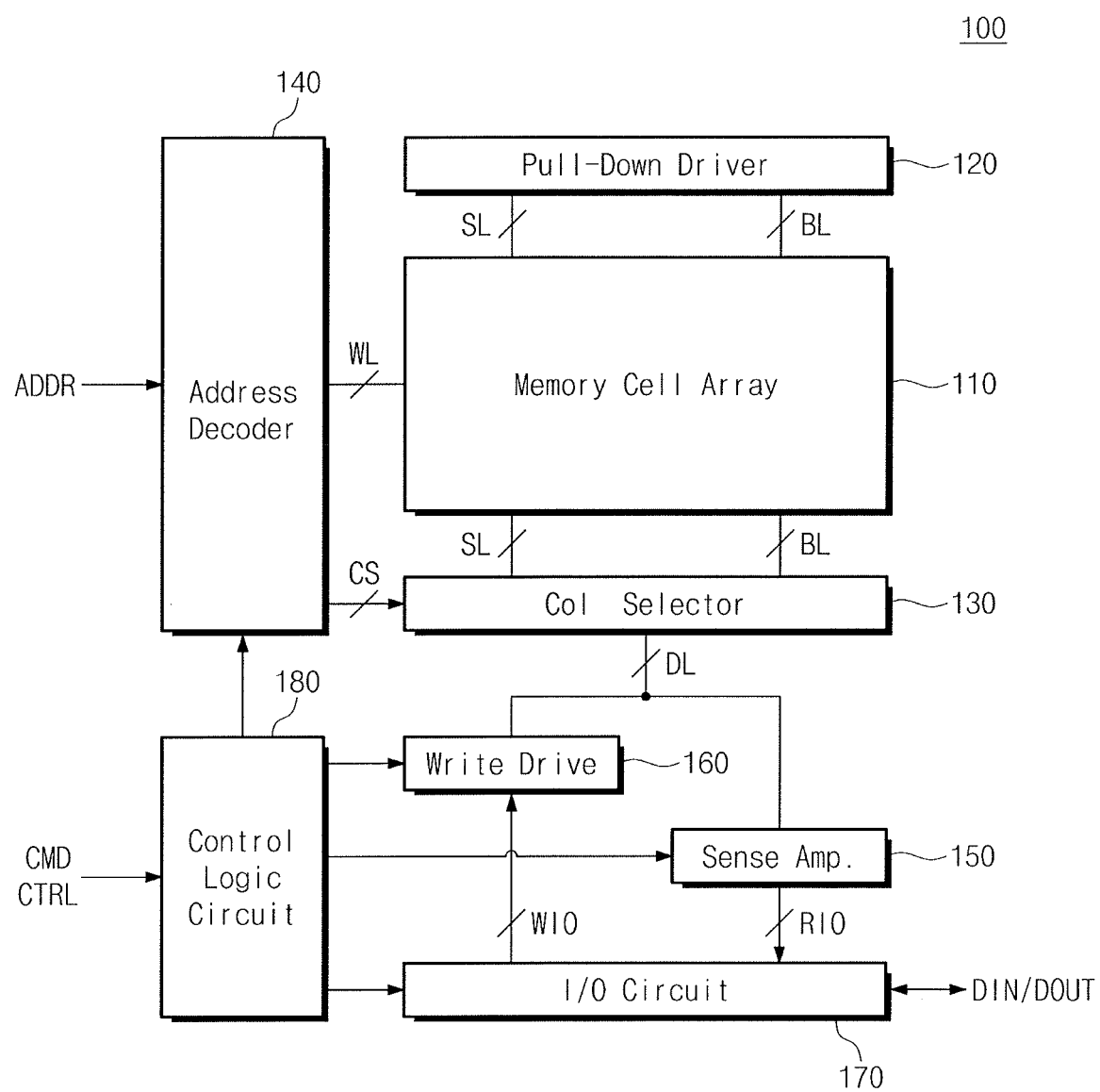
FIG. 1 illustrates a memory device according to an exemplary embodiment.

FIG. 1 illustrates a memory device according to an exemplary embodiment. Referring to FIG. 1, a memory device 100 may include a memory cell array 110, a pull-down driver 120, a column selector 130, an address decoder 140, a sense amplifier 150, a write driver 160, an input/output circuit 170, and a control logic circuit 180. In an example embodiment, the memory device 100 may be a nonvolatile memory device including nonvolatile memory cells, e.g., an MRAM. Below, to describe exemplary embodiment, the memory device 100 may be a magnetic random access memory (MRAM) device.

The memory cell array 110 may include a plurality of memory cells. The plurality of memory cells may be connected with word lines WL, bit line BL, and source lines SL. In an example embodiment, each of the plurality of memory cells may be an MRAM cell.

The pull-down driver 120 may be connected with the memory cell array 110 through the bit lines BL and the source lines SL. In a write operation of the memory device 100, the pull-down driver 120 may pull down the bit lines BL or the source lines SL to a predetermined voltage, based on pull-down data. For example, the pull-down data may correspond to write data to be written in corresponding memory cells.

For example, when data of "1" (e.g., logical high) are written in a first memory cell in the memory cell array 110, the pull-down data may correspond to the data of "1", and the pull-down driver 120 may pull down a bit line connected with the first memory cell among the bit lines BL to a predetermined voltage level. In contrast, in the case where data of "0" (e.g., logical low) are written in the first memory cell in the memory cell array 110, the pull-down data may correspond to the data of "0", and the pull-down driver 120 may pull down a source line connected with the first memory cell among the source lines SL to a predetermined voltage. In the write operation, a write current may be improved or increased by an operation of the pull-down driver 120. The pull-down driver 120 will be more fully described with reference to the following drawings.

In an example embodiment, referring to FIG. 1, the pull-down data, which are input to the pull-down driver 120, may be received through an internal write input/output line. For example, the pull-down data may be provided from the write driver 160.

The column selector 130 may be connected with the memory cell array 110 through the bit lines BL and the source lines SL. The column selector 130 may select the bit lines BL and the source lines SL in response to a column select signal CS that is provided from the address decoder 140.

The address decoder 140 may be connected with the memory cell array 110 through the word line WL. The address decoder 140 may decode an address ADDR that is received from an external device (e.g., a memory controller and a host) and may control voltages of the word lines WL based on the decoded address. For example, the address decoder 140 may provide the column select signal CS to the column selector 130 based on the decoded address ADDR.

The sense amplifier 150 may be connected with the column selector 130 through data lines DL. The sense amplifier 150 may output data through read input/output lines RIO, based on a signal received through the data lines DL.

The write driver 160 may be connected with the column selector 130 through the data lines DL. The write driver 160 may be configured to drive the data lines DL based on write data that are received through a write input/output line WIO.

In an example embodiment, the data lines DL may be connected with bit lines or source lines that are selected by the column selector 130. For example, in a read operation of the memory device 100, the sense amplifier 150 may sense a signal that is provided through the data lines DL. For example, read data DOUT may be read from memory cells corresponding to a bit line or a source line that is selected by the column selector 130 using the sense amplifier 150. In the write operation of the memory device 100, the write driver 160 controls voltages of the data lines DL based on write data DIN. For example, the write data DIN may be written in memory cells corresponding to a bit line or a source line that is selected by the column selector 130 using the write driver 160.

In an example embodiment, a data line DL may correspond to a bit line and a source line that are selected by the column selector 130.

The input/output circuit 170 may receive the write data DIN from the external device (e.g., a memory controller or a host) and may output the read data DOUT to the external device.

The control logic circuit 180 may control an operation of the memory device 100 in response to a command CMD and/or a control signal CTRL that are provided from the external device. For example, the control logic circuit 180 may activate the write driver 160 in the write operation of the memory device 100. The control logic circuit 180 may activate the sense amplifier 150 in the read operation of the memory device 100.

Figure 2:
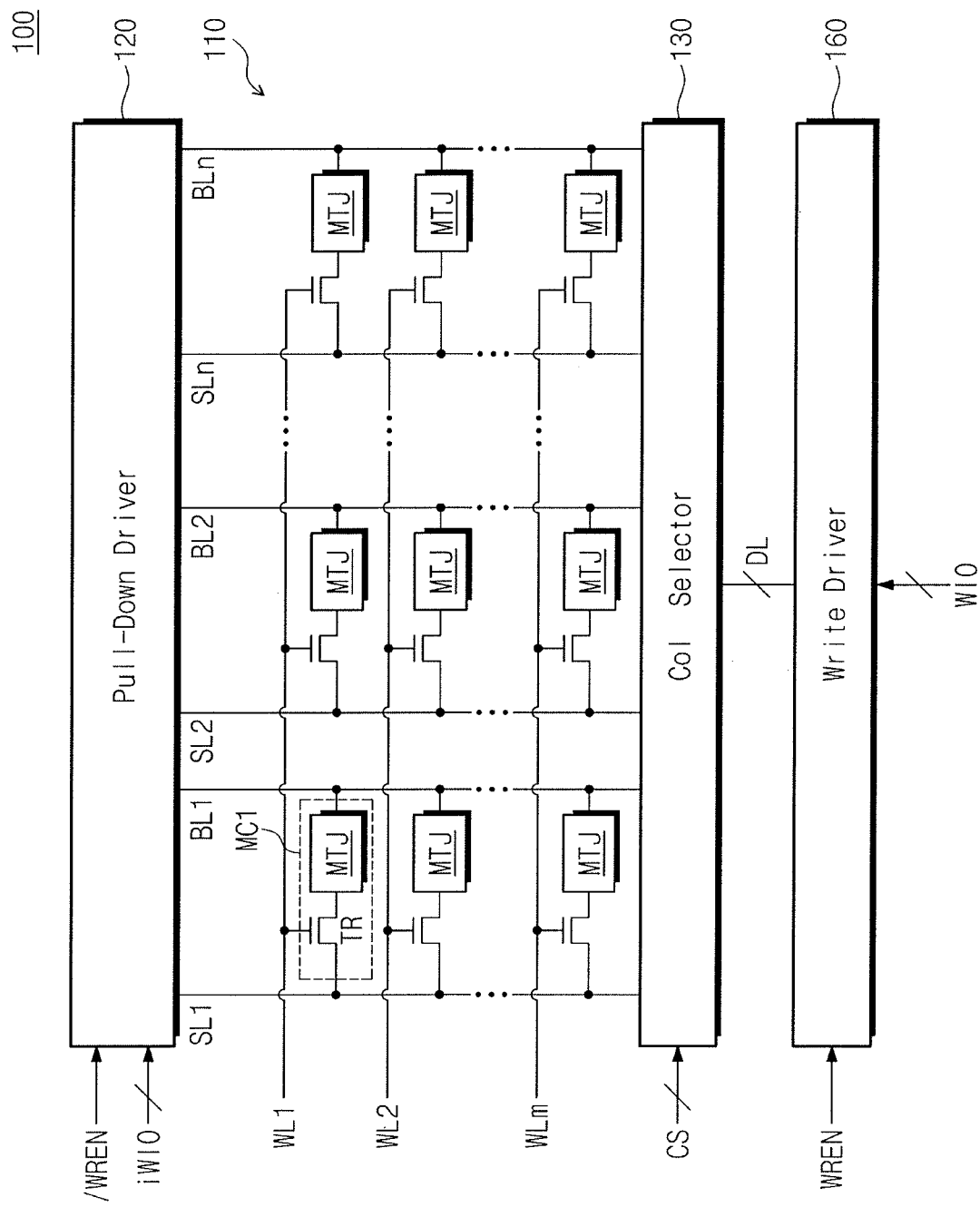
FIG. 2 illustrates a memory device of FIG. 1.
Figure 3A:
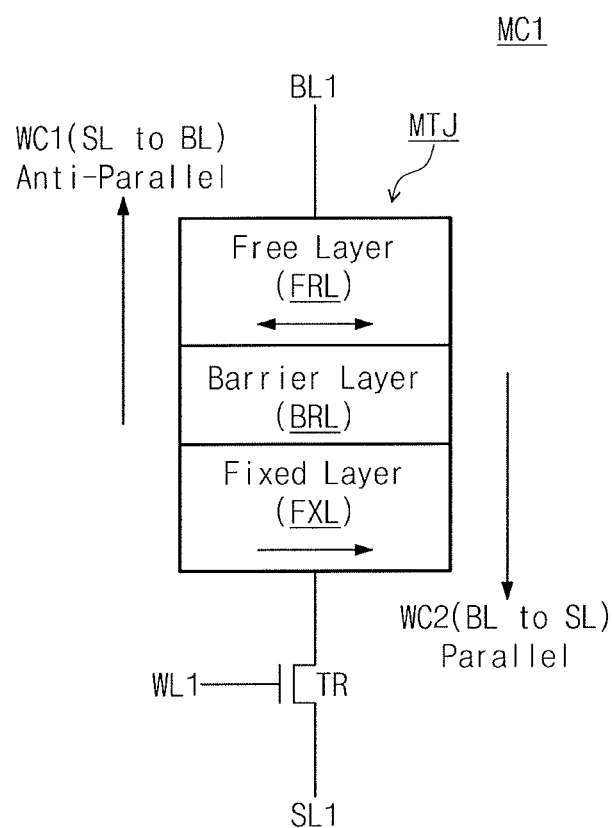
FIG. 3A illustrates a first memory cell in the memory device of FIG. 2.
Figure 3B:
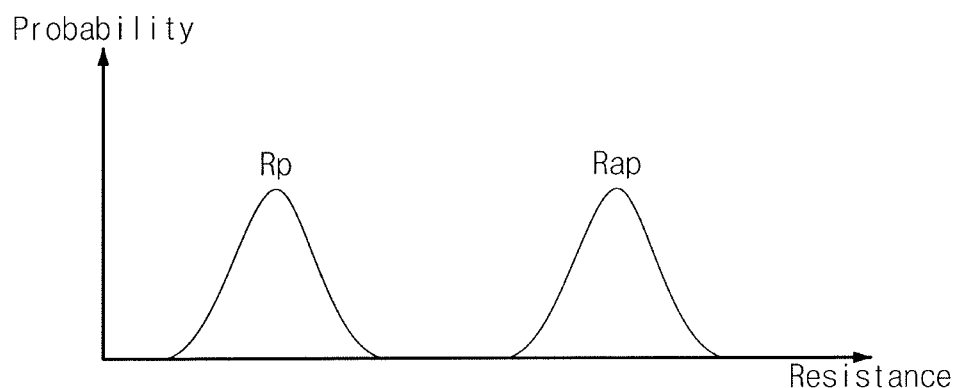
FIG. 3B illustrates resistance characteristics of the first memory cell of FIG. 3A.

FIG. 2 illustrates a memory device of FIG. 1. FIG. 3A illustrates a first memory cell of FIG. 2. FIG. 3B illustrates resistance characteristics of the first memory cell of FIG. 3A. Below, to describe a technical feature of exemplary embodiments, the exemplary embodiments will be described with reference to a write operation of the memory device 100. For example, components (e.g., the sense amplifier 150) that are unnecessary to describe the write operation of the memory device 100 are omitted in the following drawings.

Referring to FIGS. 1, 2, 3A, and 3B, the memory device 100 may include the memory cell array 110, the pull-down driver 120, the column selector 130, and the write driver 160. The pull-down driver 120, the column selector 130, and the write driver 160 are described above.

As described above, the memory cell array 110 may include a plurality of memory cells. The plurality of memory cells may be implemented with an MRAM cell and may be connected with first to n-th word lines WL1 to WLm, first to n-th bit lines BL1 to BLn, and first to n-th source lines SL1 to SLn.

For example, a first memory cell MC1 of the plurality of memory cells may include an access transistor TR and a variable resistance element (e.g., a magnetic tunnel junction (MTJ)). A first end of the access transistor TR may be connected with the first source line SL1, a second end of the access transistor TR may be connected with a first end of the variable resistance element MTJ, and a gate of the access transistor TR may be connected with the first word line WL1. A second end of the variable resistance element MTJ may be connected to the first bit line BL1. Alternatively, the first end of the access transistor TR may be connected with the first bit line BL1, the second end of the access transistor TR may be connected with the second end of the variable resistance element MTJ, and the first end of the variable resistance element MTJ may be connected to the first source line SL1.

In an example embodiment, data may be stored in each memory cell by adjusting a resistance value of the variable resistance element MTJ of each memory cell. For example, as illustrated in FIG. 3A, the variable resistance element MTJ may include a free layer FRL, a barrier layer BRL, and a fixed layer FXL. The barrier layer BRL may be interposed between the free layer FRL and the fixed layer FXL. The free layer FRL may be connected with the first bit line BL1. The fixed layer FXL may be connected with the second end of the access transistor TR. A magnetization direction of the fixed layer FXL may be fixed to a specific direction (e.g., one of left and right direction), and a magnetization direction of the free layer FRL may be changed according to a write condition. For example, the write condition may include directions of a write current (e.g., upward and downward directions). In an example embodiment, the variable resistance element MTJ may further include an anti-ferromagnetic layer for fixing the magnetization direction of the fixed layer FXL. Alternatively, the free layer FRL may be connected with the access transistor TR, and the fixed layer FXL may be connected with the first bit line BL1.

In an example embodiment, the free layer FRL may include a material that has a variable magnetization direction. The magnetization direction of the free layer FRL may be changed by an electrical/magnetic factor that is provided from the outside and/or the inside of a memory cell. The free layer FRL may include a ferromagnetic material that contains at least one of, e.g., cobalt (Co), iron (Fe), and nickel (Ni). For example, the free layer FRL may include at least one selected from, e.g., FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

In an example embodiment, the barrier layer BRL may have a thickness that is smaller than a spin diffusion length of the barrier layer BRL. The barrier layer BRL may include a non-magnetic material. For example, the barrier layer BRL may include at least one selected from, e.g., magnesium (Mg), titanium (Ti), aluminum (Al), oxide of magnesium-zinc (Mg—Zn) and magnesium-boron (MgB), and nitride of titanium (Ti) and vanadium (V).

In an example embodiment, the fixed layer FXL may have a magnetization direction that is fixed by the anti-ferromagnetic layer. The fixed layer FXL may include a ferromagnetic material. For example, the fixed layer FXL may include at least one selected from, e.g., CoFeB, Fe, Co, Ni, Gd, Dy, CoFe, NiFe, MnAs, MnBi, MnSb, CrO2, $MnOFe_2O_3$, $FeOFe_2O_3$, $NiOFe_2O_3$, $CuOFe_2O_3$, $MgOFe_2O_3$, EuO, and $Y_3Fe_5O_{12}$. In an example embodiment, the anti-ferromagnetic layer may include an anti-ferromagnetic material. For example, the anti-ferromagnetic layer may include at least one selected from, e.g., PtMn, IrMn, MnO, MnS, MnTe, $MnF_2$, $FeCl_2$, FeO, $CoCl_2$, CoO, $NiCl_2$, NiO, and Cr.

As illustrated in FIG. 3A, the magnetization direction of the free layer FRL may be changed according to directions of first and second write currents WC1 and WC2 that flows through the variable resistance element MTJ. For example, referring to the first write current WC1 illustrated in FIG. 3A, when a current flows in a direction from the first source line SL1 to the first bit line BL1 (e.g., from the fixed layer FXL to the free layer FRL), the magnetization direction of the free layer FRL may be opposite to the magnetization direction of the fixed layer FXL, which is referred to as an anti-parallel state. For example, referring to the second write current WC2 illustrated in FIG. 3A, when a current flows in a direction from the first bit line BL1 to the first source line SL1 (e.g., from the free layer FRL to the fixed layer FXL), the magnetization direction of the free layer FRL may be the same as the magnetization direction of the fixed layer FXL, which is referred to as a parallel state.

As illustrated in FIG. 3B, when the variable resistance element MTJ is in the anti-parallel state, the variable resistance element MTJ may have an anti-parallel resistance value Rap. When the variable resistance element MTJ is in the parallel state, the variable resistance element MTJ may have a parallel resistance value Rp. For example, data may be stored in the first memory cell MC1 by using a resistance value of the variable resistance element MTJ. The data stored in the first memory cell MC1 may be read by measuring the resistance value of the variable resistance element MTJ.

In an example embodiment, the first and second write currents WC1 and WC2 for changing a resistance value of the variable resistance element MTJ (i.e., a magnetization state of the variable resistance element MTJ) may be a high current, which is greater than a read current for measuring the resistance value of the variable resistance element MTJ. For example, the resistance value of the variable resistance element MTJ may be changed by providing a write current of a high level to the first memory cell MC1. For example, as a length of the first bit line BL1 or a length of the first source line SL1 becomes longer, a parasitic resistance of the first bit line BL1 or a parasitic resistance of the first source line SL1 may be increased. Thus, a write current for writing write data in the first memory cell MC1 may not have a sufficiently high level, due to a voltage drop in the first bit line BL1 or the first source line SL. Therefore, the write data may not be normally written in the first memory cell MC1, and a write error rate of the first memory cell MC1 may be increased.

In the write operation, the memory device 100 according to an exemplary embodiment may provide a write current having a high level to memory cells by selectively pulling down selected bit lines or selected source lines to a predetermined voltage based on write data to be written in the memory cells (e.g., pull-down data).

For example, the write driver 160 may control the bit lines BL1 to BLn and the source lines SL1 to SLn based on write data that are received through the write input/output line WIO. The pull-down driver 120 may selectively pull down the bit lines BL1 to BLn or the source lines SL1 to SLn based on pull-down data that are received through an internal write input/output line iWIO.

For example, when write data are stored in the first memory cell MC1, based on write data that are provided through the write input/output line WIO, the write driver 160 may provide a signal that will be provided to the first source line SL1 or the first bit line BL1 connected with the first memory cell MC1, to the column selector 130 through the data lines DL, in response to a write enable signal WREN. The column selector 130 may select the first bit line BL1 and the first source line SL1 that are connected with the first memory cell MC1 in response to the column select signal CS, and may provide the signal, which is provided from the write driver 160, to the first source line SL1 and the first bit line BL1. In response to an inverted write enable signal/WREN (i.e., an inverting signal of the write enable signal WREN), the pull-down driver 120 may pull down at least one of the first source line SL1 and the first bit line BL1 to a predetermined voltage, based on the pull-down data that are provided through the internal write input/output line iWIO. For example, the pull-down data may correspond to the write data or be the same as the write data.

For example, when the first write current WC1 is provided to the first memory cell MC1 (i.e., when data of "1" are written), the write driver 160 may provide a high voltage to the first source line SL1 and may provide a low voltage to the first bit line BL1. For example, the pull-down driver 120 may pull down the first bit line BL1 to a predetermined voltage (e.g., a ground voltage or a negative voltage). Thus, a high-current having a sufficiently high level may flow from the first source line SL1 to the first bit line BL1 through the first memory cell MC1. In contrast, when the second write current WC2 is provided to the first memory cell MC1 (i.e., when data of "0" are written), the write driver 160 may provide a low voltage to the first source line SL1 and may provide a high voltage to the first bit line BL1. In this case, the pull-down driver 120 may pull down the first source line SL1 to a predetermined voltage (e.g., a ground voltage or a negative voltage). Thus, a high-current having a sufficiently high level may flow from the first bit line BL1 to the first source line SL1 through the first memory cell MC1. Therefore, as the pull-down driver 120 pulls down the first source line SL1 or the first bit line BL1 to a predetermined voltage, a write current flowing through the first memory cell MC1 may be improved and increased to successfully write the first memory cell MC1.

According to an exemplary embodiment, when the first write current WC1 is provided to the first memory cell MC1 (i.e., when data of "1" are written), the pull-down driver 120 may pull down the first bit line BL1 to a first predetermined voltage. Further, when the second write current WC2 is provided to the first memory cell MC1 (i.e., when data of "0" are written), the pull-down driver 120 may pull down the first source line SL1 to a second predetermined voltage. For example, the first and second predetermined voltages may be same as each other. Alternatively, the first and second predetermined voltages may be different from each other. For example, the first and second predetermined voltages may be lower than a voltage correspond to data of "1" (i.e., a high logical level).

Figure 4:
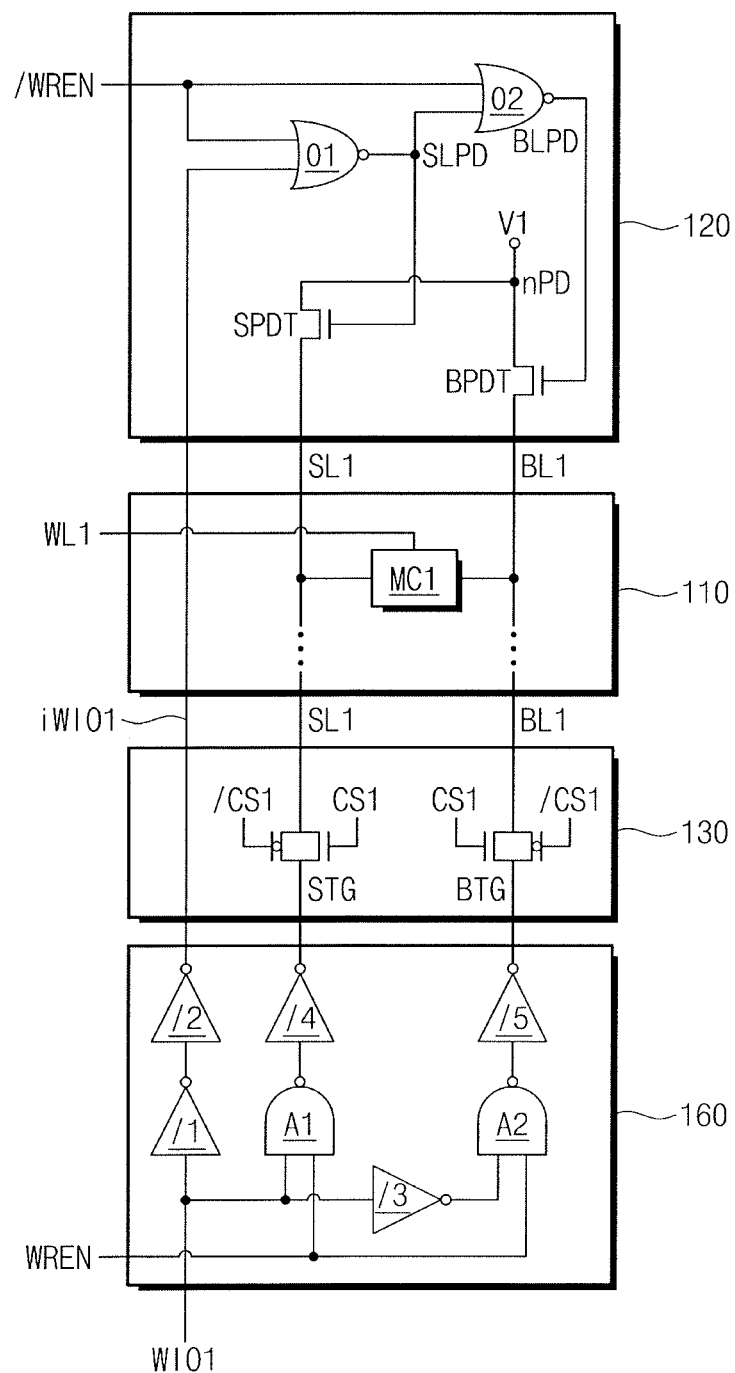
FIG. 4 illustrates circuits in the memory device of FIG. 2.

FIG. 4 illustrates a memory device of FIG. 2 in detail. For description, an embodiment of FIG. 4 will be described with reference to the first memory cell MC1.

Referring to FIGS. 2 and 4, the memory device 100 may include the memory cell array 110, the pull-down driver 120, the column selector 130, and the write driver 160. The memory cell array 110 may include the first memory cell MC1 that is connected with the first word line WL1, the first source line SL1, and the first bit line BL1. In an example embodiment, the first memory cell MC1 may be the first memory cell MC1 described with reference to FIG. 3A.

Referring to FIG. 4, the pull-down driver 120 may include first and second NOR gates O1 and O2, a source line pull-down transistor SPDT, and a bit line pull-down transistor BPDT. The first NOR gate O1 may output a source line pull-down signal SLPD by performing a NOR operation on the inverted write enable signal/WREN and a signal (i.e., pull-down data) received through a first internal write input/output line iWIO1. The second NOR gate O2 may output a bit line pull-down signal BLPD by performing a NOR operation on the inverted write enable signal/WREN and the source line pull-down signal SLPD.

The source line pull-down transistor SPDT may be connected between a pull-down node nPD and a first end of the first source line SL1, and may operate in response to the source line pull-down signal SLPD. For example, the source line pull-down transistor SPDT may pull down the first end of the first source line SL1 to a first voltage V1 of the pull-down node nPD in response to a high level of the source line pull-down signal SLPD.

The bit line pull-down transistor BPDT may be connected between the pull-down node nPD and a first end of the first bit line BL1, and may operate in response to the bit line pull-down signal BLPD. For example, the bit line pull-down transistor BPDT may pull down the first end of the first bit line BL1 to the first voltage V1 of the pull-down node nPD in response to a high level of the bit line pull-down signal BLPD. In an example embodiment, the first voltage V1 may be, e.g., a low voltage, a ground voltage, or a negative voltage.

The column selector 130 may include a source line selector STG and a bit line selector BTG. The source line selector STG and the bit line selector BTG may be respectively connected with a second end of the first source line SL1 and a second end of the first bit line BL1, and may respectively select the first source line SL1 and the first bit line BL1 in response to a first column select signal CS1 and a first inverted column select signal/CS1 (i.e., as an inverting signal of the first column select signal CS1).

The write driver 160 may include first and second NAND gates A1 and A2 and first to fifth inverters/1 to /5. The first NAND gate A1 may output an output signal by performing a NAND operation on a signal (e.g., write data) of a first write input/output line WIO1 and the write enable signal WREN. The output signal of the first NAND gate A1 may be inverted by the fourth inverter/4, and the inverted signal may be provided to the source line selector STG. For example, when the source line selector STG is turned on by the first column select signal CS1 and the first inverted column select signal/CS1, the signal provided from the fourth inverter/4 may be provided to the second end of the first source line SL1.

For example, the third inverter/3 of the write driver 160 may invert a signal provide from the first write input/output line WIO1 to output an inverted signal. The second NAND gate A2 may output an output signal by performing a NAND operation on the inverted signal from the third inverter/3 and the write enable signal WREN. The output signal of the second NAND gate A2 may be inverted by the fifth inverter/5, and the inverted signal may be provided to the bit line selector BTG. For example, when the bit line selector BTG is turned on by the first column select signal CS1 and the first inverted column select signal/CS1, the signal provided from the fifth inverter/5 may be provided to the second end of the first bit line BL1.

The signal (i.e., write data) of the first write input/output line WIO1 may be provided to the pull-down driver 120 as pull-down data through the first and second inverters/1 and /2 and the first internal write input/output line iWIO1.

The components of FIG. 4 are to describe embodiments. For example, the memory device 100 may not include some of the components illustrated in FIG. 4 or may further include any other components.

Figure 5:
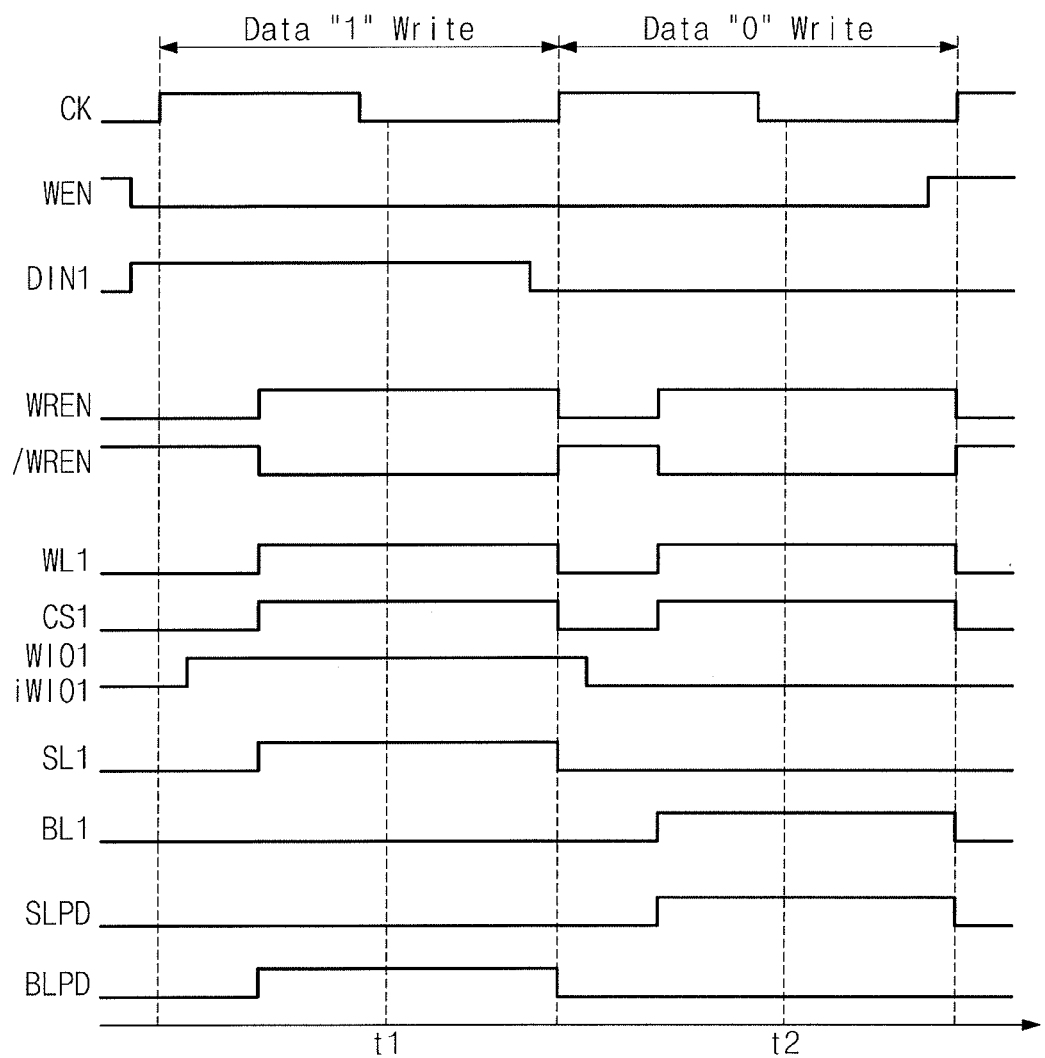
FIG. 5 illustrates a timing diagram of a write operation of the memory device of FIG. 4.

FIG. 5 illustrates a timing diagram for describing a write operation of a memory device of FIG. 4. For convenience of description, a write operation in which data of "1" and data of "0" are continuously written in the first memory cell MC1 of FIG. 4 will be described. Also, the timing diagram illustrated in FIG. 5 is an example for describing embodiments.

Below, for convenience of description, data of "1" may correspond to the anti-parallel state of the first memory cell MC1 described with reference to FIG. 3A and data of "0" corresponds to the parallel state of the first memory cell MC1 described with reference to FIG. 3A. For example, when data of "1" are written in the first memory cell MC1, the first write current WC1 may flow from the first source line SL1 to the first bit line BL1. Further, when data of "0" are written in the first memory cell MC1, the second write current WC2 may flow from the first bit line BL1 to the first source line SL1. For example, the first memory cell MC1 may have the anti-parallel state by the first write current WC1 and may have the parallel state by the second write current WC2.

Referring to FIGS. 1, 4, and 5, the memory device 100 may receive a clock signal CK, a write signal WEN, and first input data DIN1 from an external device (e.g., a memory controller or a host). In an example embodiment, the clock signal CK and the write signal WEN may correspond to the command CMD or the control signal CTRL from the external device described with reference to FIG. 1.

The memory device 100 may perform the write operation in response to the write signal WEN of a low level. For example, the control logic circuit 180 may generate the write enable signal WREN and the inverted write enable signal/WREN in response to the write signal WEN of the low level. In an example embodiment, the write enable signal WREN and the inverted write enable signal/WREN may be respectively generated in synchronization with the clock signal CK that is provided from the external device. For example, the write enable signal WREN may switch from the low level to the high level when the write signal WEN has the low level, and may switch from the high level to the low level at a rising edge of the clock signal CK. Levels of the write enable signal WREN and the inverted write enable signal/WREN may be complementary.

In response to the write enable signal WREN of the high level, the first word line WL1 and the first column select signal CS1 may transition to the high level. For example, the first word line WL1 and the first column select signal CS1 may be synchronized or non-synchronized with the write enable signal WREN. The first input data DIN1 received from the external device may be provided through the first write input/output line WIO1. For example, when the first input data DIN1 are data of "1" (e.g., logical high), a level of the first write input/output line WIO1 may be the high level. When the first input data DIN1 are data of "0" (e.g., logical low), a level of the first write input/output line WIO1 may be the low level.

For a brief description, a write operation in which data of "1" are written will be described with reference to each signal level at a first time t1 of FIG. 5. At the first time t1, a level of the write enable signal WREN is the high level, a level of the inverted write enable signal/WREN is the low level, and a level of each of the first word line WL1, the first column select signal CS1, and the first write input/output line WIO1 is the high level.

At the first time t1, as the first word line WL1 is at the high level, the access transistor TR of the first memory cell MC1 may be turned on, and as the first column select signal CS1 is at the high level, the source line selector STG and the bit line selector BTG of the column selector 130 may be turned on.

At the first time t1, as a level of each of the write enable signal WREN and the first write input/output line WIO1 is the high level, a signal that is provided from the fifth inverter/5 to the bit line selector BTG may be at the low level, and a signal that is provided from the fourth inverter/4 to the source line selector STG may be at the high level. In other words, at the first time t1, an input signal of the source line selector STG is the high level, and an input signal of the bit line selector BTG is the low level.

At the first time t1, when a level of the first write input/output line WIO1 is the high level, a level of the first internal write input/output line iWIO1 is also the high level, because the first internal write input/output line iWIO1 is generated by passing the first write input/output line WIO1 through two inverters in series (i.e., the first and second inverters/1 and /2). Further, when the first internal write input/output line iWIO1 is at the high level and the inverted write enable signal/WREN is at the low level, in the pull-down driver 120, the source line pull-down signal SLPD may be at the low level, and the bit line pull-down signal BLPD may be at the high level. The bit line pull-down transistor BPDT may be turned on in response to the high level of the bit line pull-down signal BLPD. Thus, a voltage level of the first end of the first bit line BL1 may be pulled down to the first voltage V1 of the pull-down node nPD. For example, in the first time t1, when data of "1" are written in the first memory cell MC1, the pull-down driver 120 may pull down the first bit line BL1 to the first voltage V1 such that a write current that flows from the first source line SL1 to the first bit line BL1 through the first memory cell MC, may be increased.

Next, a write operation in which data of "0" are written will be described with reference to each signal level at a second time t2 of FIG. 5. At the second time t2, levels of the first word line WL1 and the first column select signal CS1 are the same as those at the first time t1, and thus, additional description will be omitted.

At the second time t2, a level of the first write input/output line WIO1 may be the low level, and the write enable signal WREN may be the high level. For example, a signal that is provided from the fifth inverter/5 to the bit line selector BTG may be of the high level, and a signal that is provided from the fourth inverter/4 to the source line selector STG may be of the low level. In other words, at the second time t1, the input signal of the source line selector STG is the low level, and the input signal of the bit line selector BTG is the high level.

At the second time t2, when a level of the first write input/output line WIO1 is the low level, a level of the first internal write input/output line iWIO1 is also the low level, because the first internal write input/output line iWIO1 is generated by passing the first write input/output line WIO1 through the two inverters in series (i.e., the first and second inverters/1 and /2). Further, when the first internal write input/output line iWIO1 is the low level and the inverted write enable signal/WREN is the low level, in the pull-down driver 120, the source line pull-down signal SLPD may be the high level, and the bit line pull-down signal BLPD may be the low level. The source line pull-down transistor SPDT may be turned on in response to the high level of the source line pull-down signal SLPD. Thus, the voltage level of the first end of the first source line SL1 may be pulled down to the first voltage V1 of the pull-down node nPD. For example, in the second time t2, when data of "0" are written in the first memory cell MC1, the pull-down driver 120 may pull down the first source line SL1 to the first voltage V1 such that a write current that flows from the first bit line BL1 to the first source line SL1 through the first memory cell MC, may be increased.

For example, when the pull-down driver 120 is not provided, due to a parasitic resistance of the first bit line BL1 or the first source line SL1, a sufficient write current (i.e., a high current necessary to change a state of a variable resistance element) may not flow into each memory cell (e.g., the first memory cell MC1) through the first bit line BL1 and the first source line SL1. In contrast, as described above, as at least one of the first bit line BL1 and the first source line SL1 is pulled down to a predetermined voltage (e.g., the first voltage V1 of the pull-down node nPD) based on pull-down data corresponding to write data to be written, a write current having a sufficiently high level may flow to each memory cell (e.g., the first memory cell MC1).

Figure 6A:
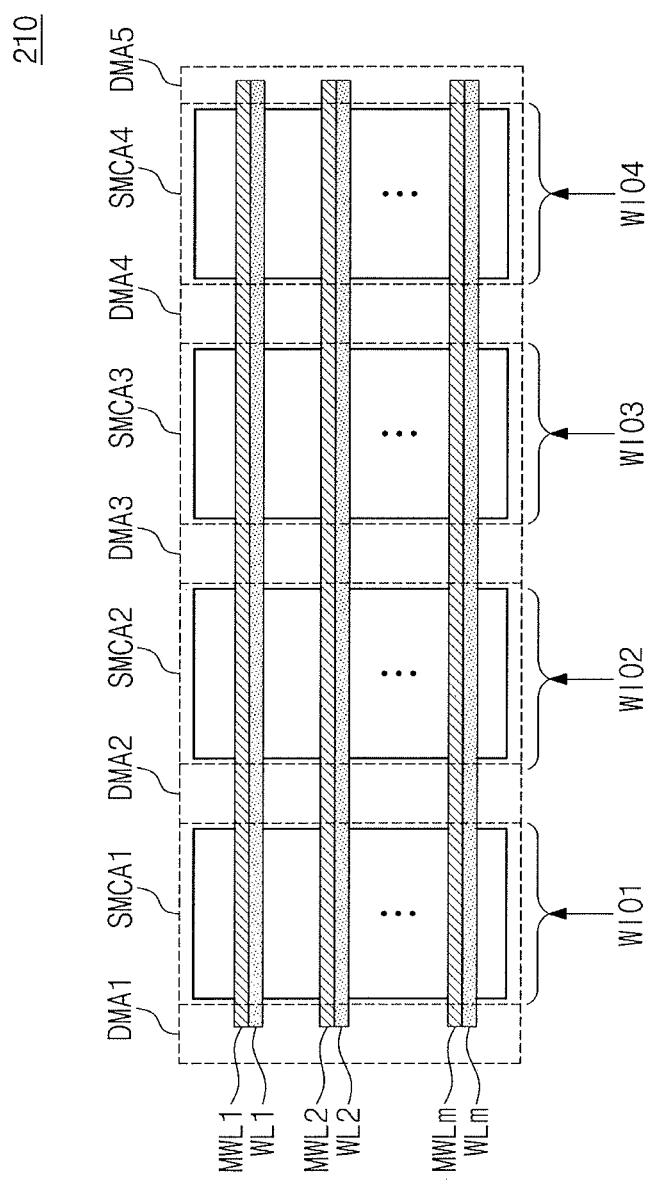
FIGS. 6A to 6D illustrate structures of a memory cell array of a memory device according to an exemplary embodiment.

FIGS. 6A to 6D illustrate a structure (e.g., a layout) of a memory cell array of a memory device according to an exemplary embodiment. Referring to FIGS. 1 and 6A to 6D, a memory cell array 210 may include a plurality of sub memory cell arrays SMCA1 to SMCA4. FIG. 6A illustrates the memory cell array 210 including four sub memory cell arrays SMCA1 to SMCA4. For example, the memory cell array 210 may further include additional sub memory cell arrays.

In an example embodiment, the plurality of sub memory cell arrays SMCA1 to SMCA4 may include a plurality of memory cells that are connected to a plurality of write input/output lines WIO1 to WIO4, respectively. For example, first group memory cells in the first sub memory cell array SMCA1 may be configured to store data that are provided through the first write input/output line WIO1. Second group memory cells in the second sub memory cell array SMCA2 may be configured to store data that are provided through the second write input/output line WIO2. Third group memory cells in the third sub memory cell array SMCA3 may be configured to store data that are provided through the third write input/output line WIO3. Fourth group memory cells in the fourth sub memory cell array SMCA4 may be configured to store data that are provided through the fourth write input/output line WIO4. For example, the plurality of sub memory cell arrays SMCA1 to SMCA4 may be divided by each of the write input/output lines WIO1 to WIO4. Alternatively, the plurality of sub memory cell arrays SMCA1 to SMCA4 may be divided in various forms or various units.

The plurality of sub memory cell arrays SMCA1 to SMCA4 may be connected with the plurality of word lines WL1 to WLm. For example, the first word line WL1 may be connected with memory cells that are positioned in a first row of the plurality of sub memory cell arrays SMCA1 to SMCA4. The second word line WL2 may be connected with memory cells that are positioned in a second row of the plurality of sub memory cell arrays SMCA1 to SMCA4. The m-th word line WLm may be connected with memory cells that are positioned in an m-th row of the plurality of sub memory cell arrays SMCA1 to SMCA4.

Figure 6B:
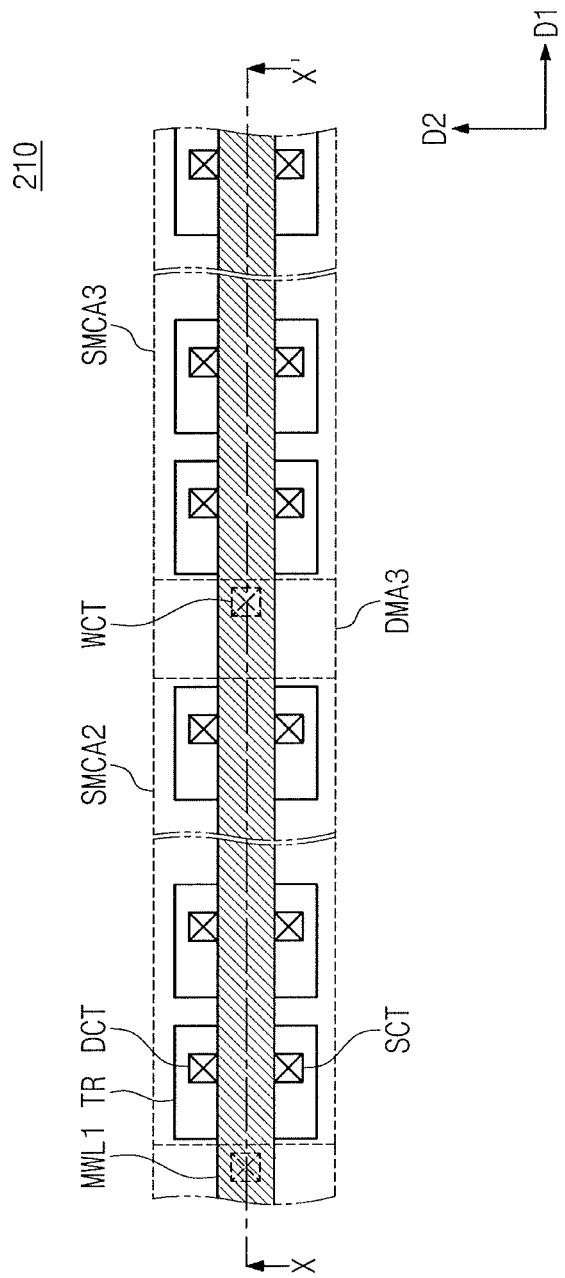

In an example embodiment, each of the plurality of word lines WL1 to WLm may be a polysilicon layer that is elongated in a row direction (i.e., a first direction D1 of FIG. 6B). For example, each of the plurality of word lines WL1 to WLm may be connected to gates of access transistors (e.g., the access transistors in FIG. 4) in memory cells of each of the plurality of sub memory cell arrays SMCA1 to SMCA4 in the row direction.

As each of the plurality of word lines WL1 to WLm is formed of a polysilicon layer, a resistance value of each of the plurality of word lines WL1 to WLm may be respectively great. Thus, voltages of the plurality of word lines WL1 to WLm may not be controlled fast and may be controlled with a delay time. Therefore, memory cells may not be driven normally and properly.

To drive memory cells normally and properly, a plurality of metal word lines MWL1 to MWLm may be formed. The plurality of metal word lines MWL1 to MWLm may be formed on the plurality of word lines WL1 to WLm, e.g., in a direction perpendicular to a top surface of a substrate SUB or in the second direction D2. Each of the plurality of metal word lines MWL1 to MWLm may be electrically connected with the corresponding word line at a plurality of dummy areas DMA1 to DMA4. Each of the plurality of metal word lines MWL1 to MWLm may be elongated along the same direction (i.e., the row direction or the first direction D1) as the plurality of word lines WL1 to WLm.

Figure 6C:
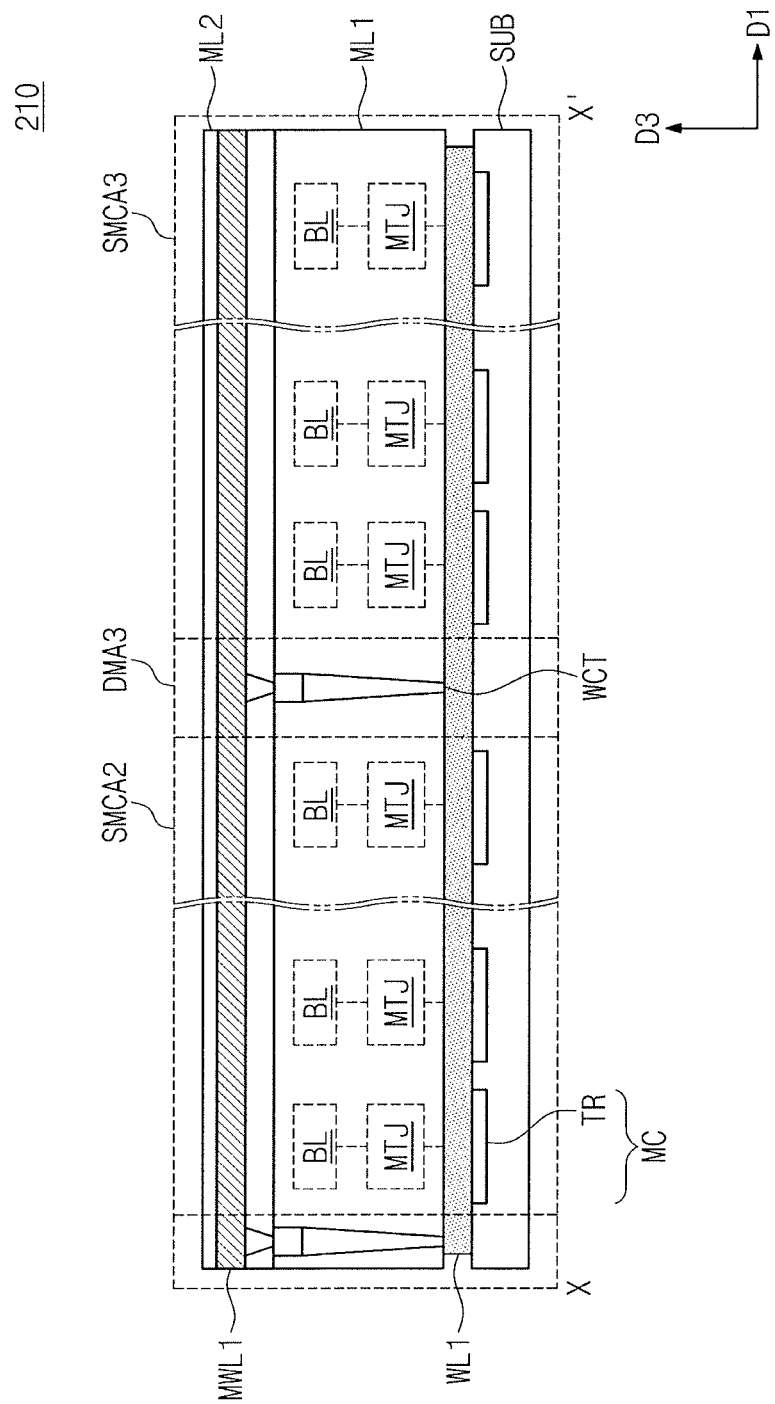

For example, FIG. 6B shows a plan view of a partial area of the memory cell array 210 of FIG. 6A. FIG. 6C shows a cross-section view of the memory cell array 210 taken along a line X-X' of FIG. 6B. As illustrated in FIGS. 6B and 6C, access transistors TR included in a plurality of memory cells MC may be formed on a semiconductor substrate SUB in the row direction (i.e., the first direction D1). Each of the access transistors TR may include a source contact SCT that is electrically connected with a corresponding source line and a drain contact DCT that is electrically connected with the corresponding variable resistance element MTJ. Gates of the access transistors TR aligned in the first direction D1 may form the first word line WL1. For example, the first word line WL1 may be formed of a polysilicon layer over the semiconductor substrate SUB. For example, the first word line WL1 may be directly on the gates of the access transistors TR.

On a plane (e.g., a top surface of the substrate SUB) defined by the first and second directions D1 and D2, the third dummy area DMA3 may be arranged between the second sub memory cell array SMCA2 and the third sub memory cell array SMCA3. The third dummy area DMA3 may include a word line contact WCT. The word line contact WCT may be configured to electrically connect the first word line WL1 and the first metal word line MWL1, and may be formed along a direction (i.e., a third direction D3) perpendicular to a top surface of the substrate SUB.

The plurality of dummy areas DMA1 to DMA5 may include a plurality of word line contacts WCT that electrically connect the plurality of metal word lines MWL1 to MWLm and the plurality of word lines WL1 to WLm. In an example embodiment, the layout of the memory cell array 210 is called a "word line strap layout".

In an example embodiment, the word line contact WCT may be formed in a first layer ML1, and the first metal word line MWL1 may be formed in a second layer ML2. In an example embodiment, the first layer ML1 may include one or more metal layers that form various metal wires or contacts, or one or more other layers that form various semiconductor devices or elements.

In an example embodiment, the first layer ML1 may include various layers that form the variable resistance element MTJ in each memory cell MC and the bit line BL that is connected with the variable resistance element MTJ. Source lines SL connected with the access transistors TR of the memory cells MC may be formed in the first layer ML1.

In an example embodiment, at least one of the variable resistance element MTJ of each memory cell MC, a bit line BL connected with each variable resistance element MTJ, and a source line SL connected with each access transistor TR may be formed in any other layer except for layers illustrated in drawings.

As described above, the memory cell array 210 may include the plurality of sub memory cell arrays SMCA1 to SMCA4, and the dummy areas DMA1 to DMA5 may be arranged between the plurality of sub memory cell arrays SMCA1 to SMCA4, respectively. The plurality of dummy areas DMA1 to DMA5 may include the word line contacts WCT that electrically connect the plurality of metal word lines MWL1 to MWLm and the plurality of word lines WL1 to WLm, respectively.

Figure 6D:
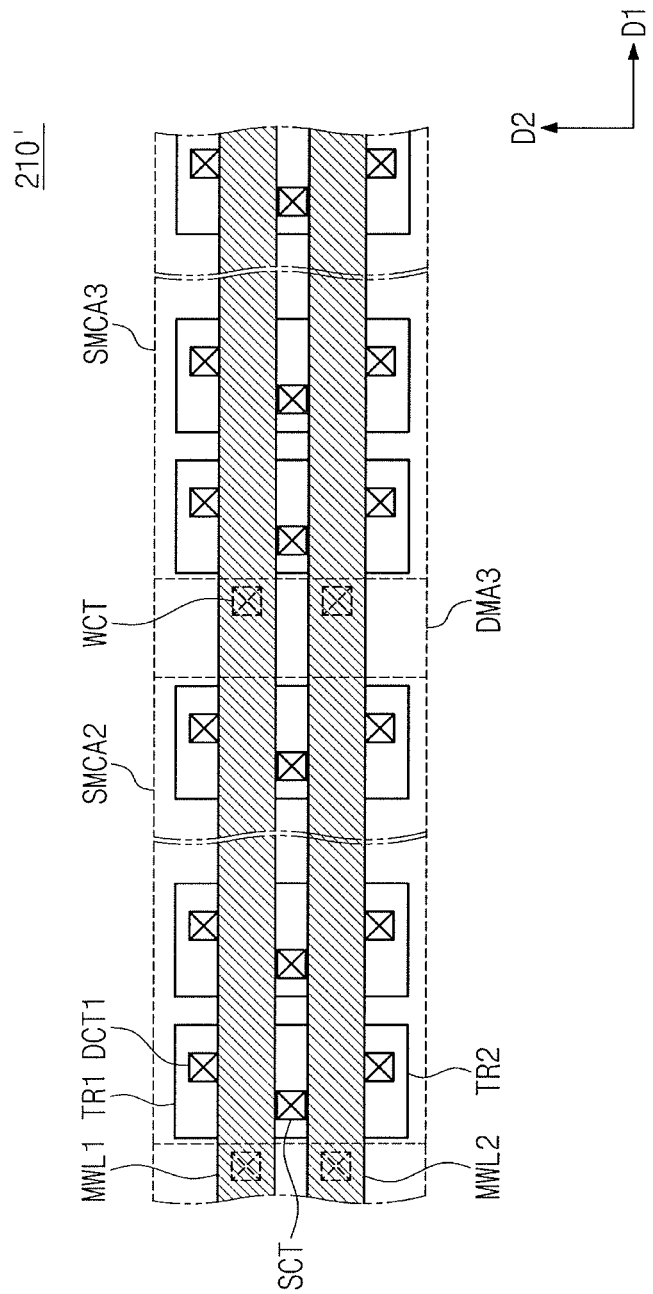

In an example embodiment, as illustrated in FIG. 6D, access transistors (e.g., first and second access transistors TR1 and TR2) of memory cells to be connected with adjacent word lines (e.g., first and second word lines WL1 and WL2) may be formed to share a source area. A memory cell array 210' of FIG. 6D is similar to the above-described configuration except that access transistors of memory cells connected with adjacent word lines share a source area, and thus, additional description will be omitted.

In an example embodiment, the layout of the memory cell array 210 is described with reference to FIGS. 6A to 6D. For example, the memory cell array 210 may be formed in a first area (e.g., a core area) on the semiconductor substrate SUB, and peripheral circuits (e.g., the pull-down driver 120, the column selector 130, the address decoder 140, the sense amplifier 150, the write driver 160, the input/output circuit 170, and the control logic circuit 180) may be formed in a second area different from the first area.

Figure 7:
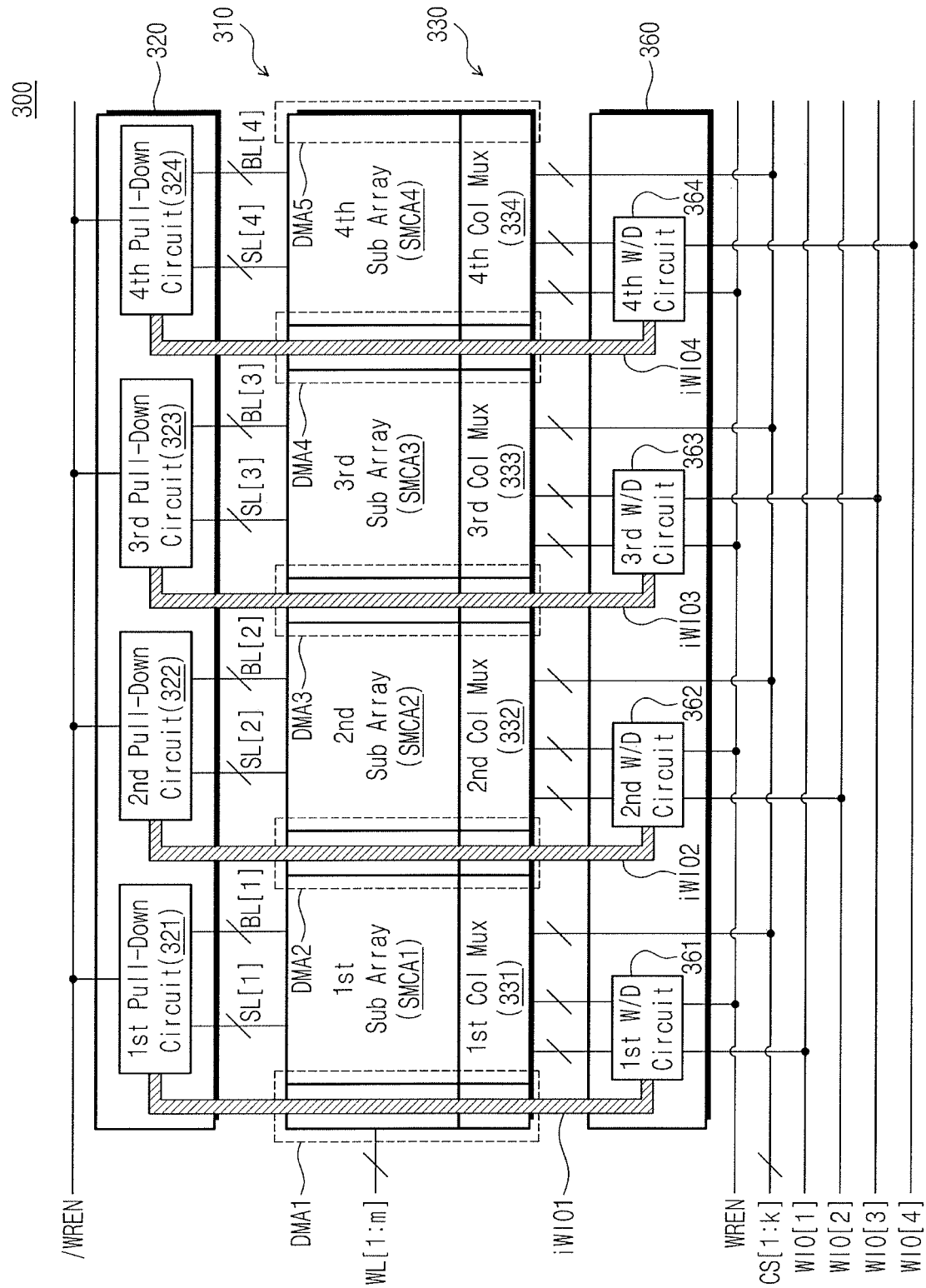
FIG. 7 illustrates a memory device according to an exemplary embodiment.

FIG. 7 illustrates a memory device according to an exemplary embodiment. For convenience of description, components which are unnecessary to describe an embodiment of FIG. 7 will be omitted. Referring to FIGS. 1, 6A to 6D, and 7, a memory device 300 may include a memory cell array 310, a pull-down driver 320, a column selector 330, and a write driver 360.

The memory cell array 310 may include the first to fourth sub memory cell arrays SMCA1 to SMCA4. The first to fourth sub memory cell arrays SMCA1 to SMCA4 may be connected with the plurality of word lines WL1 to WLm. The plurality of word lines WL1 to WLm may be configured to receive a plurality of word line signals WL[1:m], respectively. The plurality of dummy areas DMA1 to DMA5 may be arranged between the first to fourth sub memory cell arrays SMCA1 to SMCA4 or at edges of the first to fourth sub memory cell arrays SMCA1 to SMCA4. A structure of the memory cell array 310 is similar to the structure described with reference to FIGS. 6A to 6D.

The pull-down driver 320 may include first to fourth pull-down circuits 321 to 324. The first to fourth pull-down circuits 321 to 324 may be respectively connected with the first to fourth sub memory cell arrays SMCA1 to SMCA4 through the corresponding bit lines BL[1] to BL[4] and the corresponding source lines SL[1] to SL[4].

The column selector 330 may include first to fourth column multiplexers 331 to 334. Each of the first to fourth column multiplexers 331 to 334 may be configured to select the corresponding source line and the corresponding bit line in response to column select signals CS[1:k].

The write driver 360 may include first to fourth write circuits 361 to 364. The first to fourth write circuits 361 to 364 may be respectively connected with the first to fourth column multiplexers 331 to 334. The first to fourth write circuits 361 to 364 may be connected with the corresponding bit lines BL[1] to BL[4] and the corresponding source lines SL[1] to SL[4] through the first to fourth column multiplexers 331 to 334, respectively. For example, the first to fourth write circuits 361 to 364 may be respectively connected with the first to fourth sub memory cell arrays SMCA1 to SMCA4.

Each of the first to fourth write circuits 361 to 364 may control the corresponding source line and the corresponding bit line based on a signal (i.e., write data) that is received through the corresponding write input/output line WIO of a plurality of write input/output lines WIO[1] to WIO[4]. For example, the first write circuit 361 may control the first bit lines BL[1] and the first source lines SL[1] based on first write data that are received through the first write input/output line WIO[1]. The second write circuit 362 may control the second bit lines BL[2] and the second source lines SL[2] based on second write data that are received through the second write input/output line WIO[2]. The third write circuit 363 may control the third bit lines BL[3] and the third source lines SL[3] based on third write data that are received through the third write WIO[3]. The fourth write circuit 364 may control the fourth bit lines BL[4] and the fourth source lines SL[4] based on fourth write data that are received through the fourth write input/output line WIO[4]. In an example embodiment, the first to fourth write circuits 361 to 364 may respectively control the source lines and the bit lines that are selected by the first to fourth column multiplexers 331 to 334.

As a result, the first write data provided through the first write input/output line WIO[1] may be stored in memory cells in the first sub memory cell array SMCA1. The second write data provided through the second write input/output line WIO[2] may be stored in memory cells in the second sub memory cell array SMCA2. The third write data provided through the third write input/output line WIO[3] may be stored in memory cells in the third sub memory cell array SMCA3. The fourth write data provided through the fourth write input/output line WIO[4] may be stored in memory cells in the fourth sub memory cell array SMCA4.

In an example embodiment an operation of each of the first to fourth pull-down circuits 321 to 324 may be similar to the operation of the pull-down driver described with reference to FIGS. 4 and 5. For example, the first to fourth pull-down circuits 321 to 324 may pull down the source lines SL[1] to SL[4] or the bit lines BL[1] to BL[4] in response to signals (i.e., pull-down data) that are received through the corresponding internal write input/output lines iWIO1 to iWIO4. For example, the first pull-down circuit 321 may pull down either the first source lines SL[1] or the first bit lines BL[1] based on first pull-down data that are received through the first internal write input/output line iWIO1. The second pull-down circuit 322 may pull down either the second source lines SL[2] or the second bit lines BL[2] based on second pull-down data that are received through the second internal write input/output line iWIO2. The third pull-down circuit 323 may pull down either the third source lines SL[3] or the third bit lines BL[3] based on third pull-down data that are received through the third internal write input/output line iWIO4. The fourth pull-down circuit 324 may pull down either the fourth source lines SL[4] or the fourth bit lines BL[4] based on fourth pull-down data that are received through the fourth internal write input/output line iWIO4.

In an example embodiment, the first to fourth pull-down data received through the first to fourth internal write input/output lines iWIO1 to iWIO4 may be substantially the same as the first to fourth write data that are received through the first to fourth write input/output lines WIO[1] to WIO[4]. In other words, the first to fourth write circuits 361 to 364 may be configured to provide the first to fourth write data, which are received through the first to fourth write input/output lines WIO[1] to WIO[4], to the first to fourth pull-down circuits 321 to 324 through the first to fourth internal write input/output lines iWIO1 to iWIO3. For example, the first to fourth internal write input/output lines iWIO1 to iWIO4 may be metal lines that are formed to cross (i.e., to pass through) the memory cell array 310.

For example, the first internal write input/output line iWIO1 may be a metal line that is elongated from the first write circuit 361 to the first pull-down circuit 321. For example, the first internal write input/output line iWIO1 may be formed in the first dummy area DMA1 of the memory cell array 310. The second internal write input/output line iWIO2 may be a metal line that is elongated from the second write circuit 362 to the second pull-down circuit 322. For example, the second internal write input/output line iWIO2 may be formed in the second dummy area DMA2 of the memory cell array 310. The third internal write input/output line iWIO3 may be a metal line that is elongated from the third write circuit 363 to the third pull-down circuit 323. For example, the third internal write input/output line iWIO3 may be formed in the third dummy area DMA3 of the memory cell array 310. The fourth internal write input/output line iWIO4 may be a metal line that is elongated from the fourth write circuit 364 to the fourth pull-down circuit 324. For example, the fourth internal write input/output line iWIO4 may be formed in the fourth dummy area DMA4 of the memory cell array 310.

As described above, as the first to fourth internal write input/output lines iWIO1 to iWIO4 for the first to fourth pull-down circuits 321 to 324 are formed of metal lines in the dummy areas DMA1 to DMA4 of the memory cell array 310, the complexity of metal wires that are required to implement a memory device according to exemplary embodiments, may decrease. Thus, the area of the memory device may decrease.

For example, as illustrated in FIG. 7, on the substrate SUB (refer to FIGS. 6A and 6B), the pull-down driver 320 may be formed in a first area positioned on the first side of a core area, in which the memory cell array 310 is formed, and the write driver 360 may be formed in a second area positioned on the second side of the core area. For example, the second area may indicate an area facing away from the first area. Alternatively, the core area may be arranged between the first and second areas. For example, on the substrate SUB along the second direction D2 (refer to FIG. 2), the first area (in which the write driver 360 is formed), the core area (in which the memory cell array 310 is formed), and the second area (in which the pull-down driver is formed) may be arranged. Thus, to route the first to fourth internal write input/output lines iWIO1 to iWIO4 to the pull-down driver 320, an area for an additional metal wire may be required in a peripheral area.

In contrast, according to an exemplary embodiment, the first to fourth internal write input/output lines iWIO1 to iWIO4 for the pull-down driver 320 may be formed of metal lines in the dummy areas DMA1 to DMA4 of the core area, in which the memory cell array 310 is formed. The core area may include sub memory cell array areas and dummy areas. The sub memory cell array areas and the dummy areas may be arranged along the first direction D1 (refer to FIG. 6B) on the substrate SUB. For example, as a plurality of internal write input/output lines are formed in dummy areas for the word line strap layer without an additional area for the first to fourth internal write input/output lines iWIO1 to iWIO4, the complexity of the memory device may be decreased. Thus, the area of the memory device may be decreased.

Figure 8A:
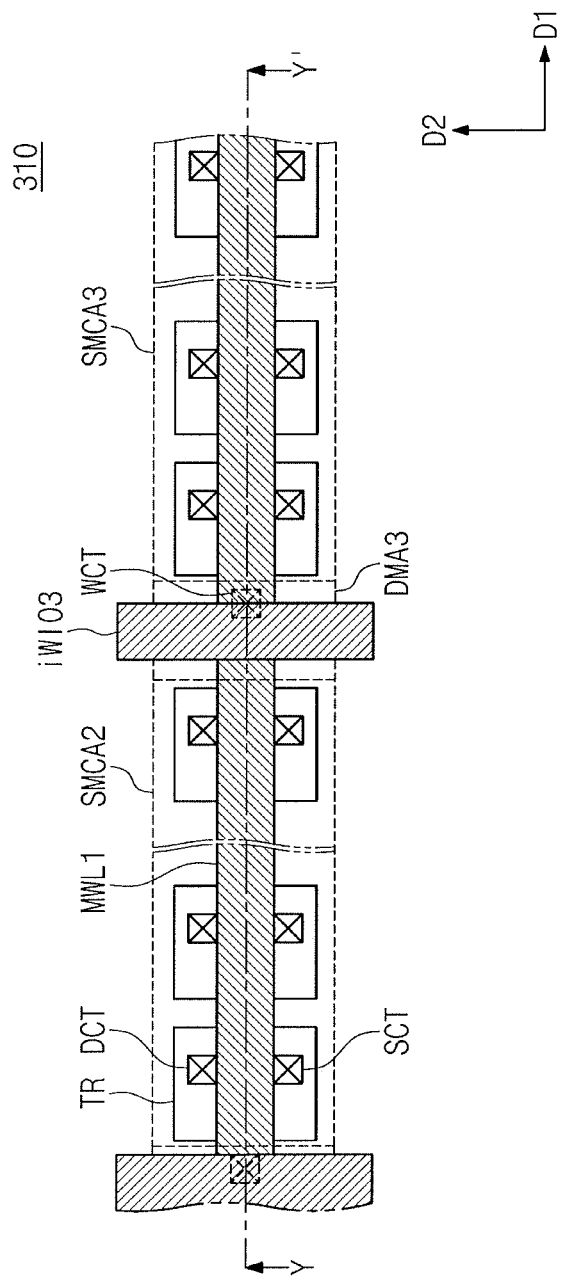
FIGS. 8A and 8B illustrate a memory cell array in the memory device of FIG. 7.
Figure 8B:
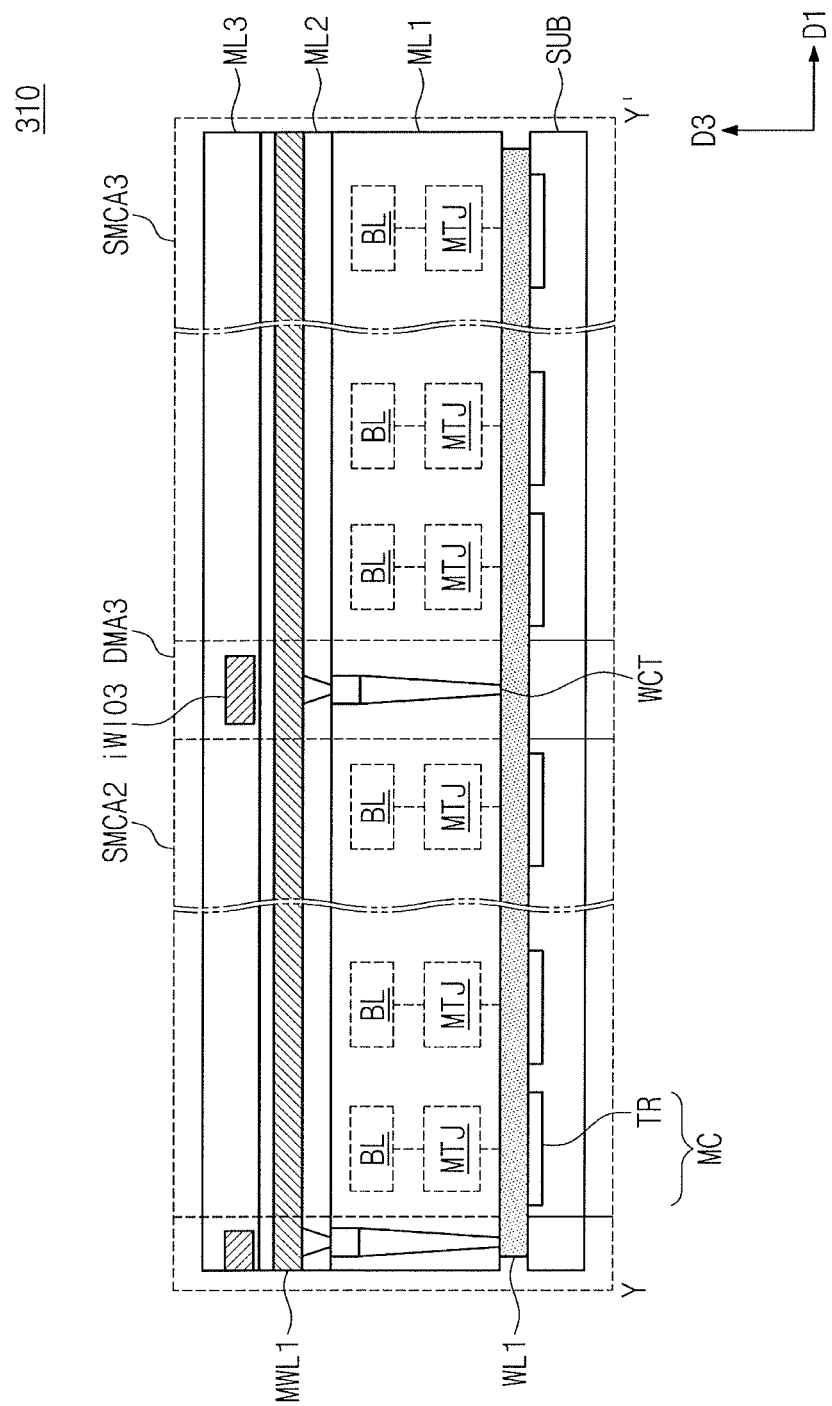

FIGS. 8A and 8B illustrate a memory cell array of FIG. 7. FIG. 8A shows a plan view of the substrate SUB, in which memory cells MC connected with the first word line WL1 are formed). FIG. 8B shows a cross-section view of a memory cell array taken along a line Y-Y' of FIG. 8A. For convenience of description, the description associated with the above components and components unnecessary to describe an exemplary embodiment will be omitted.

Referring to FIGS. 7, 8A, and 8B, as described above, the memory cell array 310 may include the second and third sub memory cell arrays SMCA2 and SMCA3. As described above, the third dummy area DMA3 may be arranged between the second and third sub memory cell arrays SMCA2 and SMCA3. The first metal word line MWL1 may be formed along the first direction D1, and may be electrically connected with a first word line (or a polysilicon layer of memory cells) that is connected with memory cells of the second and third sub memory cell arrays SMCA2 and SMCA3 through the word line contact WCT of the third dummy area DMA3.

For example, a metal line for the third internal write input/output line iWIO3 may be formed in the third dummy area DMA3. Below, for convenience of description, a metal line formed in a dummy area for an internal write input/output line is referred to as an "internal metal line", and is marked by the same reference mark/numeral of the corresponding internal write input/output line. The third internal metal line iWIO3 may be elongated in the second direction D2 (e.g., a direction perpendicular to the first direction D1) different from the first direction D1, in which the first metal word line MWL1 is elongated. Third pull-down data may be provided from the third write circuit 363 to the third pull-down circuit 323 through the third internal metal line iWIO3 that is formed in the third dummy area DMA3.

In an example embodiment, an internal metal line may be formed in a different layer from a metal word line. For example, as illustrated in FIG. 8B, the access transistors TR of the memory cells MC may be formed on the substrate SUB, and gates of the access transistors TR arranged in the first direction D1 may form the first word line WL1.

First to third layers ML1 to ML3 may be stacked in a direction (i.e., the third direction D3) perpendicular to a top surface of the substrate SUB. For example, the first layer ML1 may be formed on the first word line WL1. In the first layer ML1, the variable resistance elements MTJ of the memory cells MC and the corresponding bit lines BL may be formed in areas corresponding to the second and third sub memory cell arrays SMCA2 and SMCA3. In the first layer ML1, the word line contact WCT may be formed in an area corresponding to the third dummy area DMA3. The first layer ML1 may further include a plurality of layers for forming the various components described above. The first layer ML1 is described with reference to FIG. 6C, and thus, additional description will be omitted.

The second layer ML2 may be formed on the first layer ML1. The second layer ML2 may include the first metal word line MWL1 that is electrically connected with the first word line WL1 through the word line contact WCT. The first metal word line MWL1 and the first word line WL1 may be elongated along the first direction D1.

The third layer ML3 may be formed on the second layer ML2. The third layer ML3 may include the third internal metal line iWIO3. In the third layer ML3, the third internal metal line iWIO3 may be positioned in the third dummy area DMA3. That is, the third layer ML3 may be elongated in a direction (i.e., the second direction D2) perpendicular to a direction (i.e., the first direction D1) in which a metal word line or a word line is elongated, and may be stacked in a direction (i.e., the third direction D3) perpendicular to a top surface of the metal word line or a top surface of the substrate SUB.

As described above, as the internal write input/output lines iWIO1 to iWIO4 for the pull-down driver 320 or the plurality of pull-down circuits 321 to 324 are provided through metal lines in the dummy areas DMA of the memory cell array 310, the area of the memory device and the complexity of metal lines may be decreased.

In an example embodiment, the internal metal lines respectively formed in the dummy areas DMA1 to DMA4 may be elongated in a direction (i.e., the second direction D2) perpendicular to a direction (i.e., the first direction D1) in which a plurality of word lines WL are elongated. In an example embodiment, the internal metal lines respectively formed in the dummy areas DMA1 to DMA4 may be elongated in a direction parallel to a plurality of bit lines BL and a plurality of source lines SL.

In an example embodiment, the internal metal lines respectively formed in the dummy areas DMA1 to DMA4, the plurality of bit lines BL, and the plurality of source lines SL may be formed in different layers, or a part thereof may be formed in the same layer. For example, the internal metal lines and the plurality of bit lines BL may be formed in the same layer (i.e., in the third layer ML3). Alternatively, an additional layer may be further formed on the third layer ML3, and the plurality of bit lines BL or the plurality of source lines SL may be included in the additional layer. For example, an element of each memory cell MC, or the bit lines BL, the source lines SL, or the metal word lines MWL connected with the memory cells MC may be formed in various layers.

Figure 9:
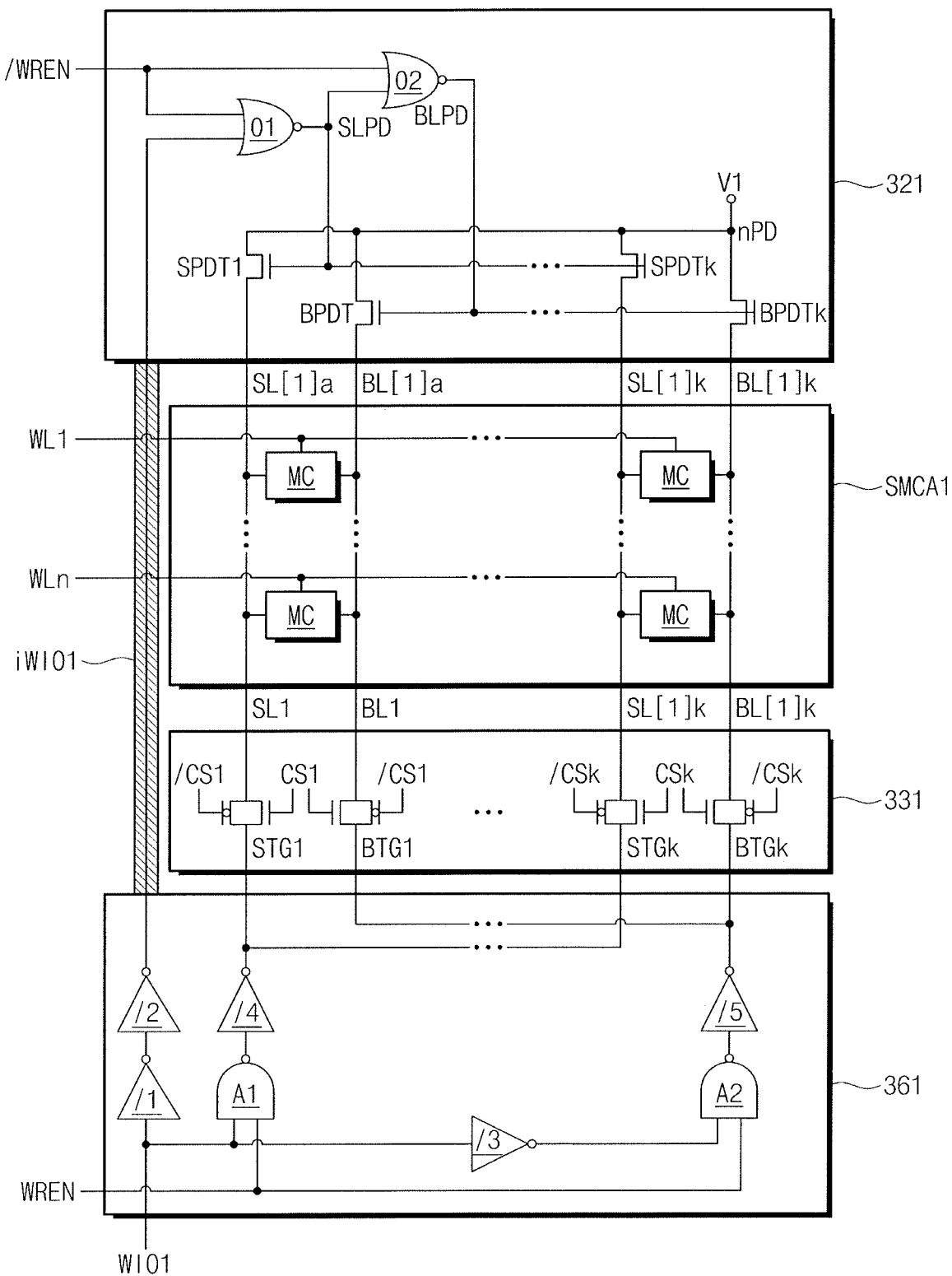
FIG. 9 illustrates a first sub memory cell array, a first pull-down circuit, a first column multiplexer, and a first write circuit of the memory device of FIG. 7.

FIG. 9 illustrates a first sub memory cell array, a first pull-down circuit, a first column multiplexer, and a first write circuit of a memory device of FIG. 7. FIG. 9 illustrates an example for describing an operation for driving the first sub memory cell array SMCA1 according to an exemplary embodiment. In an example embodiment, structures of other sub memory cell arrays, other pull-down circuits, other column multiplexers, and other write circuits may be similar to the structure of the embodiment illustrated in FIG. 9.

Referring to FIGS. 7 and 9, the first sub memory cell array SMCA1 may include a plurality of memory cells MC. In an example embodiment, each of the memory cells MC may be a memory cell (i.e., an MRAM cell) as described with reference to FIGS. 3A and 3B. The plurality of memory cells MC may be connected with the word lines WL1 to WLm, source lines SL[1]a to SL[1]k, and bit lines BL[1]a to BL[1]k.

The first pull-down driver 320 may include the first and second NOR gates O1 and O2 a plurality of source line pull-down transistors SPDT1 to SPDTk, and a plurality of bit line pull-down transistors BPDT1 to BPDTk. As described above, the first NOR gate O1 and the second NOR gate O2 may generate the source line pull-down signal SLPD and the bit line pull-down signal BLPD, respectively.

The plurality of source line pull-down transistors SPDT1 to SPDTk may be respectively connected between the pull-down node nPD and the plurality of source lines SL[1]a to SL[1]k and may operate in response to the source line pull-down signal SLPD. For example, the plurality of source line pull-down transistors SPDT1 to SPDTk may pull down the plurality of source lines SL[1]a to SL[1]k to the first voltage V1 in response to the source line pull-down signal SLPD.

The plurality of bit line pull-down transistors BPDT1 to BPDTk may be respectively connected between the pull-down node nPD and the plurality of bit lines BL[1]a to BL[1]k and may operate in response to the bit line pull-down signal BLPD. For example, the plurality of bit line pull-down transistors BPDT1 to BPDTk may pull down the plurality of bit lines BL[1]a to BL[1]k to the first voltage V1 in response to the bit line pull-down signal BLPD.

The first column multiplexer 331 may select the corresponding source line and the corresponding bit line in response to column select signals CS1 to CSk. Signals provided from the first write circuit 361 may be provided to a corresponding memory cell through the selected source line and the selected bit line.

The first write circuit 361 may include the first and second NAND gates A1 and A2 and the first to fifth inverters /1 to /5. The components of the first write circuit 361 are similar to the components of the write driver 160, which are described with reference to FIG. 4, except that an output of the fourth inverter /4 is provided to a plurality of source line selectors STG1 to STGk and an output of the fifth inverter /5 is provided to a plurality of bit line selectors BTG1 to BTGk. Thus, additional description will be omitted.

As described above, one sub memory cell array (e.g., SMCA1) may correspond to one write input/output line (e.g., WIO1). For example, data that are provided through a first write input/output line WIO1 may be stored in the plurality of memory cells MC in the first sub memory cell array SMCA1 by the first write circuit 361 and the first pull-down circuit 321.

In an example embodiment, the first internal write input/output line iWIO1 may be connected between the first write circuit 361 and the first pull-down circuit 321 and may be routed to the first pull-down circuit 321 through a metal line (i.e., a metal line of a dummy area) as described with reference to FIGS. 7 to 8B. For example, the metal line of the dummy area may extend along sides of the first column multiplexer 331 and the first sub memory cell array SMCA1

Figure 10:
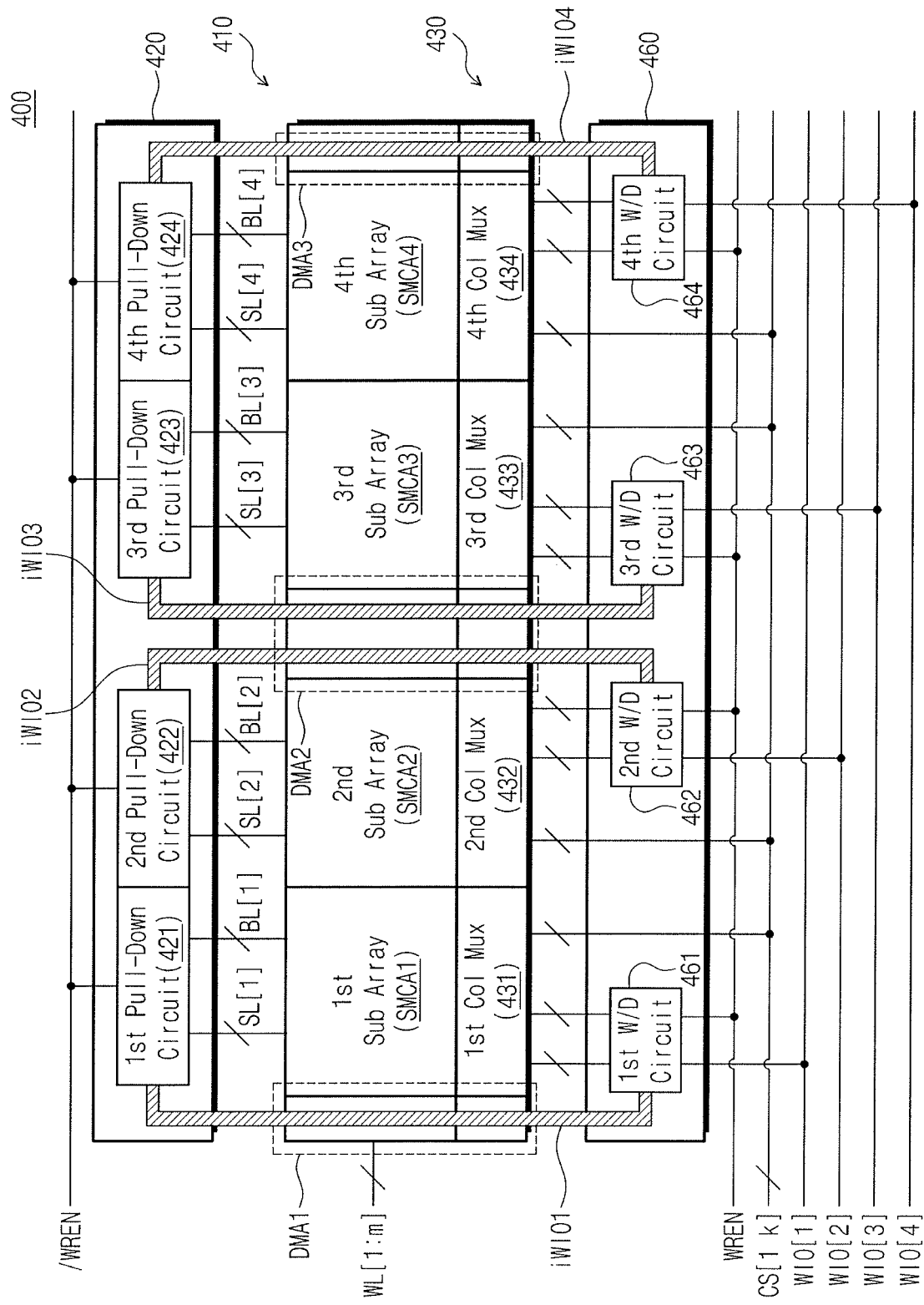
FIG. 10 illustrates a memory device according to an exemplary embodiment.

FIG. 10 illustrates a memory device according to an exemplary embodiment. Referring to FIG. 10, a memory device 400 may include a memory cell array 410, a pull-down driver 420, a column selector 430, and a write driver 460. The pull-down driver 420 may include first to fourth pull-down circuits 421 to 424. The column selector 430 may include first to fourth column multiplexers 431 to 434. The write driver 460 may include first to fourth write circuits 461 to 464. Each component is described above, and thus, additional description will be omitted.

The memory cell array 410 may include the first to fourth sub memory cell arrays SMCA1 to SMCA4. For example, the memory cell array 410 of FIG. 10 may include first to third areas DMA1 to DMA3. The first and second sub memory cell arrays SMCA1 and SMCA2 may be adjacent to each other (i.e., a dummy area may not be between the first and second sub memory cell arrays SMCA1 and SMCA2). The first dummy area DMA1 may be positioned on one side of the first sub memory cell array SMCA1.

The second dummy area DMA2 may be between the second and third sub memory cell arrays SMCA2 and SMCA3. The third and fourth sub memory cell arrays SMCA3 and SMCA4 may be adjacent to each other (i.e., a dummy area may not be between the third and fourth sub memory cell arrays SMCA3 and SMCA4). The third dummy area DMA3 may be positioned on one side of the fourth sub memory cell array SMCA4.

For example, in the memory cell array 410, one dummy area may be arranged per two sub memory cell arrays. For example, a specific dummy area may include at least two internal metal lines. For example, as illustrated in FIG. 10, the first dummy area DMA1 may include a first internal metal line for the first internal write input/output line iWIO1. The second dummy area DMA2 may include second and third internal metal lines for the second and third internal write input/output lines iWIO2 and iWIO3. The third dummy area DMA3 may include a fourth internal metal line for the fourth internal write input/output line iWIO4. For example, at least two internal metal lines may be formed in a specific dummy area based on the number of sub memory cell arrays included in the memory cell array 410 and the number of dummy areas included therein.

In an example embodiment, when at least two internal metal lines are formed in one dummy area, the at least two internal metal lines may be formed in the same layer, or the at least two internal metal lines may be respectively formed in different layers. Alternatively, a part of the at least two internal metal lines may be formed in the same layer, and the remaining ones thereof may be formed in different layers.

According to an exemplary embodiment, a memory cell array may include a plurality of sub memory cell arrays connected with a plurality of word line elongated along a first direction, and a dummy area may be per "i" sub memory cell arrays ("i" being a natural number). One dummy area may include at least one metal line elongated along a second direction perpendicular to the first direction. An internal write input/output line that is used by a pull-down driver, may be implemented with at least one metal line.

Figure 11:
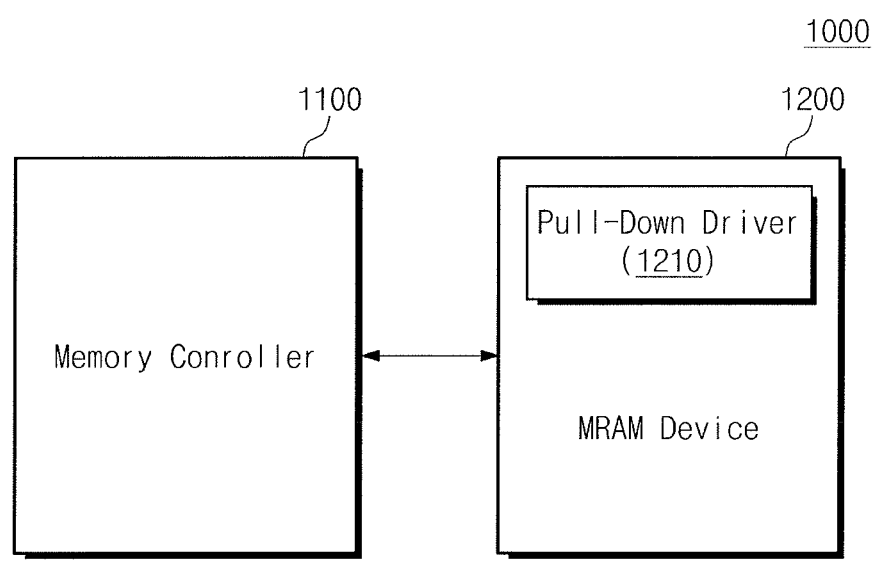
FIG. 11 illustrates a memory system according to an exemplary embodiment.

FIG. 11 illustrates a memory system according to an exemplary embodiment. Referring to FIG. 11, a memory system 1000 may include a memory controller 1100 and a memory device 1200. The memory controller 1100 may be configured to control the memory device 1200. In an example embodiment, the memory controller 1100 may be a semiconductor integrated circuit, e.g., a central processing unit (CPU) or an application processor (AP), or may be one of components including the semiconductor integrated circuit.

In an example embodiment, the memory controller 1100 may control the memory device 1200 based on an interface. In an example embodiment, the interface may be based on at least one of various interfaces, e.g., a double data rate (DDR) interface, a low-power DDR (LPDDR) interface, a universal serial bus (USB) interface, a multimedia card (MMC) interface, a peripheral component interconnection (PCI) interface, a PCI-express (PCI-e) interface, an advanced technology attachment (ATA) interface, a serial-ATA (SATA) interface, a parallel-ATA (PATA) interface, a small computer small interface (SCSI) interface, an enhanced small disk interface (ESDI), an integrated drive electronics (IDE) interface, a mobile industry processor interface (MIPI), a nonvolatile memory-express (NVM-e) interface, and a universal flash storage (UFS) interface.

The memory device 1200 may operate under control of the memory controller 1100. In an example embodiment, the memory device 1200 may be one of the MRAM devices as described with reference to FIGS. 1 to 10. For example, the memory device 1200 may include a pull-down driver 1210, and may pull down any one of a corresponding bit line and a corresponding source line to a predetermined voltage based on write data.

According to exemplary embodiments, at least one of a bit line and a source line connected with memory cells may be pulled down based on write data. For example, a write current may be improved upon performing a write operation on the memory cells, and thus, reliability of a memory device may be improved.

According to an exemplary embodiment, as a signal are provided to a pull-down driver through a metal line (e.g., an internal write input/output line) that is formed in a dummy area of a memory cell array, the area of the memory device may be decreased.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device comprising:
 a first memory cell connected with a first source line, a first word line, and a first bit line;
 a first write circuit to receive first write data through a first write input/output line, the first write data to be stored in the first memory cell, and to control a voltage of the first source line and a voltage of the first bit line based on the first write data; and
 a first pull-down circuit to receive first pull-down data corresponding to the first write data from the first write circuit through a first internal metal line, and to pull down the voltage of one of the first source line and the first bit line to a predetermined voltage based on the first pull-down data.

2. The memory device as claimed in claim 1, wherein the first memory cell includes:
 a first access transistor; and
 a variable resistance element connected to the first access transistor,
 wherein the first access transistor and the variable resistance element are connected between the first source line and the first bit line, and
 wherein the first access transistor operates in response to a voltage of the first word line.

3. The memory device as claimed in claim 2, wherein, when each of the first write data and the first pull-down data is a first logical level, the first write circuit provides a signal of a high level to the first source line and the first pull-down circuit pulls down the first bit line to the predetermined voltage,
 wherein, when each of the first write data and the first pull-down data is a second logical level different from the first logical level, the first write circuit provides the signal of the high level to the first bit line and the first pull-down circuit pulls down the first source line to the predetermined voltage.

4. The memory device as claimed in claim 1, wherein the first write circuit includes:
 a first NAND gate to output a first output signal by performing a NAND operation on a write enable signal and the first write data;
 a second NAND gate to output a second output signal by performing a NAND operation on the write enable signal and first inverted write data that are generated by inverting the first write data;
 a first inverter that inverts the first output signal to output a first inverted output signal to the first source line;
 a second inverter that inverts the second output signal to output a second inverted output signal to the first bit line; and
 third and fourth inverters being connected in series, the third and fourth inverters to provide the first pull-down data to the first internal metal line by at least two times inverting the first write data that are provided through the first write input/output line.

5. The memory device as claimed in claim 4, wherein the first pull-down circuit includes:
a first NOR gate to output a source line pull-down signal by performing a NOR operation on the first pull-down data and an inverted write enable signal that is generated by inverting the write enable signal;
a second NOR gate to output a bit line pull-down signal by performing a NOR operation on the inverted write enable signal and the source line pull-down signal;
a source line pull-down transistor being connected between the first source line and a pull-down node for receiving the predetermined voltage, the source line pull-down transistor to operate in response to the source line pull-down signal; and
a bit line pull-down transistor being connected between the pull-down node and the first bit line, the bit line pull-down transistor to operate in response to the bit line pull-down signal.

6. The memory device as claimed in claim 1, wherein:
the first write circuit is in a first area of a semiconductor substrate,
the first pull-down circuit is in a second area of the semiconductor substrate,
the first memory cell is in a core area between the first area and the second area of the semiconductor substrate, and
the first internal metal line crosses the core area and extends from the first area to the second area.

7. The memory device as claimed in claim 6, wherein the first internal metal line, the first bit line, and the first source line extend in a same direction.

8. The memory device as claimed in claim 6, wherein:
the core area includes a sub memory cell array area and a dummy area,
the first memory cell is in the sub memory cell array area, and
a word line contact electrically connects between the first word line connected with the first memory cell and a first metal word line, extends in a direction perpendicular to a top surface of the semiconductor substrate, and is in the dummy area.

9. The memory device as claimed in claim 8, wherein the first internal metal line is in the dummy area.

10. The memory device as claimed in claim 9, wherein:
the dummy area includes a first layer, a second layer, and a third layer that are stacked on the semiconductor substrate in the direction perpendicular to the top surface of the semiconductor substrate,
the word line contact is in the first layer corresponding to the dummy area,
the first metal word line is in the second layer, and
the first internal metal line is in the third layer corresponding to the dummy area.

11. A memory device, comprising:
a first sub memory cell array including first memory cells that are respectively connected with a plurality of word lines;
a second sub memory cell array including second memory cells that are respectively connected with the plurality of word lines;
a dummy area between the first and second sub memory cell arrays, a first internal metal line and a second internal metal line being in the dummy area;
a first write circuit to control a voltage of a first bit line and a voltage of a first source line based on first write data received through a first write input/output line, the first bit line and the first source line being connected with the first memory cells;
a first pull-down circuit to receive first pull-down data corresponding to the first write data from the first write circuit through the first internal metal line and to pull down the voltage of the first source line or the voltage of the first bit line to a first predetermined voltage based on the first pull-down data;
a second write circuit to control a voltage of a second bit line and a voltage of a second source line based on second write data that are received through a second write input/output line, the second bit line and the second source line being connected with the second memory cells; and
a second pull-down circuit to receive second pull-down data corresponding to the second write data from the second write circuit through the second internal metal line and to pull down the voltage of the second source line or the voltage of the second bit line to a second predetermined voltage based on the second pull-down data.

12. The memory device as claimed in claim 11, wherein each of the first memory cells and the second memory cells is a magnetic random access memory (MRAM) cell.

13. The memory device as claimed in claim 11, further comprising:
a plurality of metal word lines extending in a same direction as the plurality of word lines extend.

14. The memory device as claimed in claim 13, further comprising a plurality of word line contacts being in the dummy area, electrically connecting the plurality of word lines and the plurality of metal word lines, and extending in a direction perpendicular to a top surface of a semiconductor substrate.

15. The memory device as claimed in claim 14, wherein the first internal metal line and the second internal metal line extend in the dummy area in a direction perpendicular to a direction in which the plurality of metal word lines extend.

16. The memory device as claimed in claim 14, wherein:
first, second, and third layers are sequentially stacked on the semiconductor substrate,
the plurality of word line contacts are in the first layer corresponding to the dummy area,
the plurality of metal word lines are in the second layer, and
the first and second internal metal lines are in the third layer corresponding to the dummy area.

17. A memory device, comprising:
a memory cell array in a core area of a semiconductor substrate, the memory cell array including a plurality of memory cells connected to a plurality of word lines;
a write driver in a peripheral area of the semiconductor substrate, the write driver to control voltages of a plurality of bit lines and voltages of a plurality of source lines based on first write data that are received through write input/output lines, the plurality of bit lines and the plurality of source lines being connected with the plurality of memory cells; and
a pull-down driver to receive first pull-down data corresponding to the first write data from the write driver through at least one internal metal line and to pull down the voltages of the plurality of bit lines or the voltages of the plurality of source lines to a predetermined voltage based on the first pull-down data, wherein the at least one internal metal line crosses the core area and extends from the write driver to the pull-down driver.

18. The memory device as claimed in claim 17, wherein the core area includes:
   a first sub memory cell array area including first memory cells of the plurality of memory cells:
   a second sub memory cell array area including second memory cells of the plurality of memory cells: and
   a dummy area between the first and second sub memory cell array areas, and
   wherein a plurality of word line contacts electrically connect between the plurality of word lines and a plurality of metal word lines that extend in a same direction as the plurality of word lines extend.

19. The memory device as claimed in claim 18, wherein the at least one internal metal line is in the dummy area.

20. The memory device as claimed in claim 17, wherein the at least one internal metal line extends in a same direction as the plurality of bit lines and the plurality of source lines extend.

\* \* \* \* \*